United States Patent
Thies et al.

(10) Patent No.: US 7,781,773 B2
(45) Date of Patent: *Aug. 24, 2010

(54) TRANSISTOR ARRAY FOR SEMICONDUCTOR MEMORY DEVICES AND METHOD FOR FABRICATING A VERTICAL CHANNEL TRANSISTOR ARRAY

(75) Inventors: Andreas Thies, Berlin (DE); Klaus Muemmler, Dresden (DE)

(73) Assignee: Qimonda AG, Munich (DE)

( * ) Notice: Subject to any disclaimer, the term of this patent is extended or adjusted under 35 U.S.C. 154(b) by 138 days.

This patent is subject to a terminal disclaimer.

(21) Appl. No.: 12/042,822

(22) Filed: Mar. 5, 2008

(65) Prior Publication Data

US 2008/0150012 A1  Jun. 26, 2008

Related U.S. Application Data

(63) Continuation of application No. 10/998,975, filed on Nov. 30, 2004, now Pat. No. 7,355,230.

(51) Int. Cl.
*H01L 27/108* (2006.01)

(52) U.S. Cl. .......... 257/68; 257/296; 257/300; 257/302; 257/307; 257/E27.084

(58) Field of Classification Search .......... 257/68, 257/71, 296, 302, 905, 300, 307
See application file for complete search history.

(56) References Cited

U.S. PATENT DOCUMENTS

| | | | |
|---|---|---|---|
| 6,034,389 A | 3/2000 | Burns, Jr. et al. | |
| 6,037,209 A | 3/2000 | Rosner et al. | |
| 6,348,374 B1 | 2/2002 | Athavale et al. | |
| 6,355,520 B1 | 3/2002 | Park et al. | |
| 6,424,009 B1 | 7/2002 | Ju | |
| 6,455,886 B1 | 9/2002 | Mandelman et al. | |
| 6,504,201 B1 | 1/2003 | Noble et al. | |
| 6,537,870 B1 * | 3/2003 | Shen | 438/243 |
| 6,740,917 B2 | 5/2004 | Beer | |
| 6,818,937 B2 | 11/2004 | Noble et al. | |
| 7,253,493 B2 | 8/2007 | Wang et al. | |
| 7,355,230 B2 * | 4/2008 | Thies et al. | 257/296 |
| 2002/0130346 A1 | 9/2002 | Athavale et al. | |
| 2003/0205740 A1 | 11/2003 | Ahn | |

* cited by examiner

*Primary Examiner*—Wai-Sing Louie
(74) *Attorney, Agent, or Firm*—Edell, Shapiro & Finnan, LLC

(57) ABSTRACT

A transistor array for semiconductor memory devices is provided. A plurality of semiconductor pillars extending outwardly from a bulk section of a semiconductor substrate is arranged in rows and columns. Each pillar forms an active area of a vertical channel access transistor. Insulating trenches are formed between the rows of pillars. Buried word lines extend within the insulating trenches along the rows of pillars. Bit line trenches are formed between columns of pillars. Bit lines extend perpendicular to the word lines in lower portions of the bit line trenches. A first and a second column of pillars face adjacent each bit line. Each bit line is coupled to the active areas in the pillars of the first column of pillars via a single sided bit line contact formed from polycrystalline silicon and is insulated from the active areas of the pillars of the second column of pillars.

14 Claims, 17 Drawing Sheets

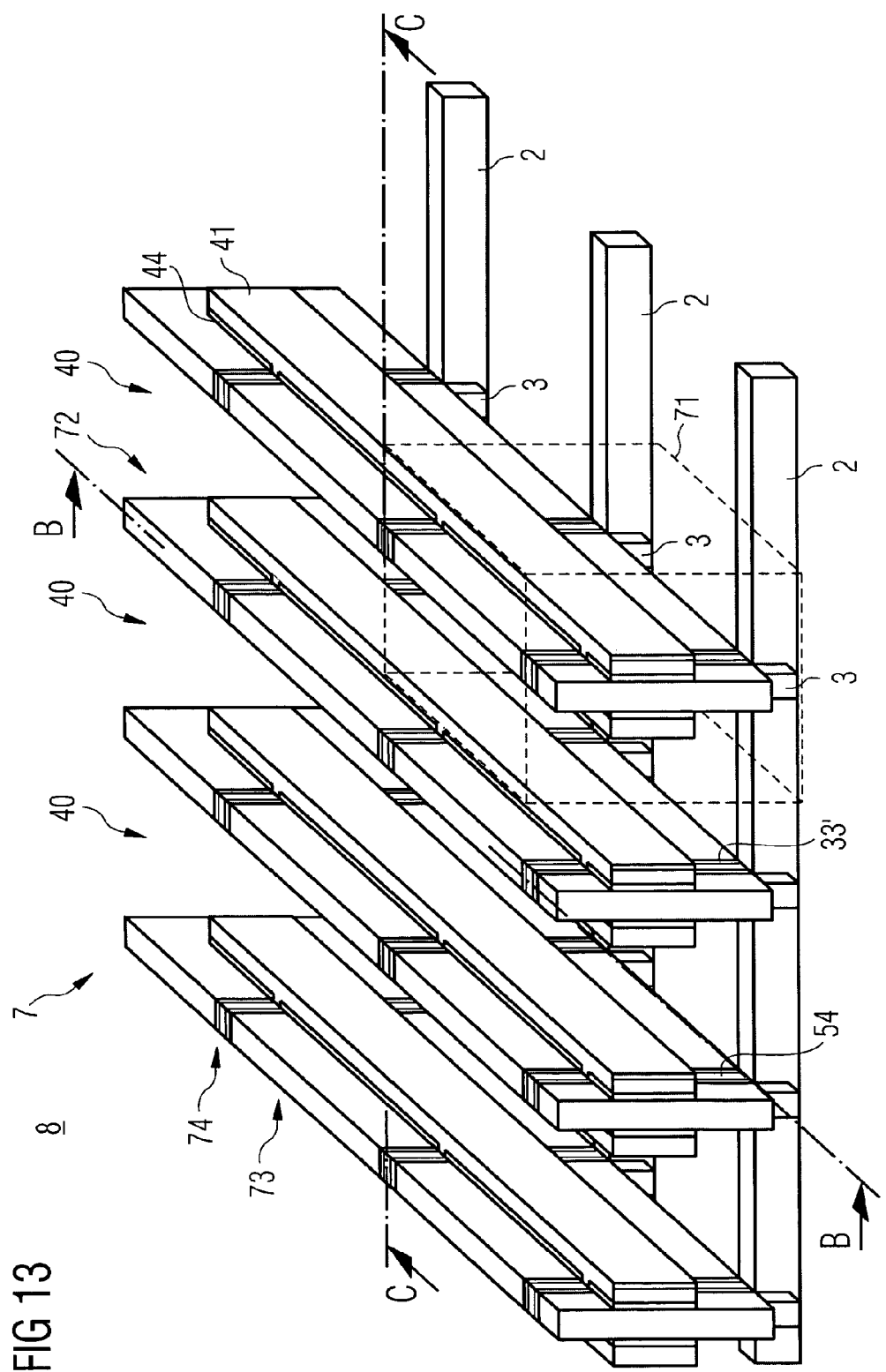

TRANSISTOR ARRAY FOR SEMICONDUCTOR MEMORY DEVICES AND METHOD FOR FABRICATING A VERTICAL CHANNEL TRANSISTOR ARRAY

CROSS REFERENCE TO RELATED APPLICATIONS

This application is a continuation of U.S. patent application Ser. No. 10/998,975 filed Nov. 30, 2004, entitled "Transistor Array for Semiconductor Memory Devices and Method for Fabricating a Vertical Channel Transistor Array," the entire contents of which is hereby incorporated by reference.

FIELD OF THE INVENTION

The present invention relates to transistor arrays for semiconductor memory devices having vertical channel access transistors and buried bit and word lines. The present invention relates further to a method for fabricating transistor arrays with vertical channel access transistors.

BACKGROUND

A semiconductor memory cell comprises a storage device for storing data and an access device for accessing the data stored in the storage device. Capacitors, magnetic junction elements, ferroelectric polarization elements and phase change elements are types of storage devices used in semiconductor memory cells.

In capacitors data is stored by capacitor's charge or lack of charge. In magnetic junction elements data is stored by alignment of the magnetization of a ferromagnetic storage layer with reference to the magnetization of a ferromagnetic reference layer.

Storage devices may be located on top of the access devices. Typically, field-effect access transistors (FETs) are used as access devices.

An active area of the access transistor is formed in a single crystalline semiconductor substrate. The active area comprises a first doped region defining a first source/drain-region, a second doped region defining a second source/drain-region and a channel region between the first and the second source/drain-region. The first and the second doped region have a first conductivity type. The channel region is not doped or is of a second conductivity type, which is contrary to the first conductivity type.

In a vertical channel access transistor the first doped region is buried in the semiconductor substrate and coupled to a buried bit line. The bit line transmits data to and from the memory cell. The second doped region is formed adjacent to an upper surface of the substrate and is coupled to the storage device.

Spacer type gate structures or wrap-around type gate structures are provided to achieve high cell packaging densities.

The respective gate structure is formed adjacent to the channel region. A gate dielectric insulates the gate structure from the channel region.

By applying a voltage higher than a threshold voltage to the gate structure, a conductive channel is formed in the channel region between the first and the second doped regions. The conductive channel connects the storage device to the bit line. Otherwise, the storage device remains insulated from the bit line.

FIG. 14A is a plan view of a memory cell array with a plurality of memory cells according to prior art. Each memory cell comprises a stacked capacitor and a vertical channel access transistor in a wrap-around type gate spacer layout.

The memory cells are disposed in rows 72 and columns 73. Active areas 6 of vertical channel access transistors 71 are formed in pillars 16 extending outwardly from a bulk section 15 of semiconductor substrate 1. Stacked storage capacitors 83 are disposed on top of active areas 6. Insulating structures 42 separate active areas 6 of neighboring rows 72. Wrap around type gate structures 43 are formed on the sidewalls of active areas 6. The gate structures 43 of adjacent access transistors 71 of each row 72 are coupled to each other and form word lines 41. The word lines 41 extend along the rows 72. The insulating structures 42 separate the word lines 41 of neighboring rows 72 from one another.

FIG. 14B is a cross-section of the layout of FIG. 14A along section line B-B. Stacked capacitors 83 having a bottom electrode 831, a top electrode 833, and a dielectric layer 832 there between are disposed on top of the active areas 6. Each bottom electrode 831 is connected to a contact plug 834. The contact plugs 834 extend downwards to a portion of the respective active area 6. A second doped region 62 is formed in the active area 6 adjacent to the contact plug 834. An interlayer dielectric 46 is provided to separate contact plugs 834.

Bit lines 2 are buried in the semiconductor substrate 1 extending along columns 73 and running perpendicular to rows 72. Each bit line 2 is coupled to first doped regions 61 of the active areas 6 of access transistors 71 disposed along the respective column 73. The first doped regions 61 are formed below the second doped regions 62. A channel region 63 separates each first doped region 61 from the respective second doped region 62.

When spacer gate 43 is activated, access transistor 71 conducts and charges or discharges storage capacitor 83 in accordance with data on the buried bit line 2.

Transistor arrays of this type are described in U.S. Pat. No. 6,504,201, U.S. Pat. No. 6,355,520 B1 and U.S. Patent Application Ser. No. 20030205740.

In each of the patent documents cited above, the buried bit lines are provided by an ion implantation resulting in doped line structures within the single crystalline semiconductor substrate. The active areas are formed on top of the bit lines, such that the first doped region merge to some extend in the bit lines and a low contact resistance between the bit lines and the active areas is achieved.

Buried bit lines formed by implants into the semiconductor substrate suffer from high electric resistance due to limitations for the implanted dopant concentration and general semiconductor properties. A resistivity of lower than $5*10^{-4}$ $\Omega$cm cannot be achieved.

With shrinking feature seize a need exists for an improved high density packaging layout for an access transistor array that provides lower bit line resistance and improved cell performance.

Further, the layout as described above suffers from the separation of the channel region from the bulk section of the substrate, which results in an accumulation of minority charge carriers in the channel region. The accumulated minority carriers deteriorate the cell characteristics.

Another need exists, therefore, for a vertical channel access transistor array with channel regions coupled to the bulk sections of the substrate to avoid floating-gate effects.

A further need exists for a method for fabricating access transistor arrays with vertical channel access transistors with bit lines having low electric resistance and with channel regions being coupled to the bulk substrate.

SUMMARY

In one aspect, the present invention provides an access transistor array comprising a plurality of vertical channel access transistors. The active areas of the vertical channel access transistors are formed in semiconductor pillars extending outwardly from a bulk section of the semiconductor substrate. The pillars are arranged in rows and columns. The rows of pillars are separated by insulating trenches. Insulating plugs are arranged in columns of insulating plugs. Each insulating plug separates adjacent pillars within the rows. Each column of insulating plugs has opposing first and second sides respectively, wherein the first side is adjacent to a first column of pillars and the second side is adjacent to a second column of pillars. The access transistors are controlled by a voltage applied to a word line that is coupled capacitive to the respective access transistor. The word lines are arranged within the insulating trenches. Each word line is disposed adjacent to the pillars of the respective row of pillars and extends along the respective insulating trench. A gate dielectric separates the word lines from the respective pillars. The vertical channel access transistors are connected to bit lines that transfer electric charge. The bit lines are disposed below the insulating plugs and extend along the columns of insulating plugs. Each bit line is coupled to the active areas in the pillars of the first column of pillars by means of a single sided bit line contact while being insulated from the active areas of the pillars of the second column of pillars.

Thus according to a first aspect, the invention provides a high density vertical channel transistor array for memory devices, such as DRAMs, MRAMs, FeRAMs and PCRAMs, with the material for the bit lines being selectable from high conductivity materials such as transition metals like tungsten, tantalum, titanium and transition metal compounds like tungsten nitride.

According to a preferred embodiment each active area comprises a first and a second doped region and a channel region between the first and the second doped region. The first and the second doped regions are of a first conductivity type. The channel regions are not doped or of a second conductivity type, which is contrary to the first conductivity type. Each channel region separates the first and the second doped region of the respective active area. The second doped region is formed in an upper section of the active area adjacent to a surface of the substrate. The first doped region is formed in a lower portion of said active area adjacent to the respective single sided bit line contact. The word lines are disposed adjacent to the channel regions. The bit lines are coupled to the first doped regions. Each active area comprises further a body contact region. The body contact regions are of the second conductivity type. Each body contact region is formed adjacent to the respective first doped region. The body contact region separates the first doped region from the adjacent bit line and extends from the channel region to the bulk section of the substrate.

Thus, each body contact region connects the channel region of the respective active area to the bulk section of the semiconductor substrate. An accumulation of minority charge carriers in the channel region is avoided and cell performance is enhanced.

In another aspect, the present invention provides a DRAM memory device comprising a plurality of memory cells, wherein each memory cell comprises a vertical channel access transistor and a charge storage device. The active areas of the vertical channel access transistors are formed in semiconductor pillars extending outwardly from a bulk section of the semiconductor substrate. The pillars are arranged in rows and columns. The rows of pillars are separated by insulating trenches. Insulating plugs are arranged in columns of insulating plugs. Each insulating plug separates adjacent pillars within the rows. Each column of insulating plugs has opposing first and second sides respectively, wherein the first side is adjacent to a first column of pillars and the second side is adjacent to a second column of pillars. The access transistors are controlled by a voltage applied to a respective word line. The word lines are arranged within the insulating trenches. Each word line is disposed adjacent to the pillars of the respective row of pillars and extends along the respective insulating trench. A gate dielectric separates the word lines from the respective pillars. The vertical channel access transistors are connected to bit lines that transfer electric charge. The bit lines are disposed below the insulating plugs and extend along the columns of insulating plugs. Each bit line is coupled to the active areas in the pillars of the first column of pillars by means of a single sided bit line contact while being insulated from the active areas of the pillars of the second column of pillars. Each storage capacitor is disposed above the respective access transistor and is electrically connected to the respective active area.

Thus the invention provides a high density DRAM memory device, with the material for the bit lines being selectable from high conductivity materials such as transition metals like tungsten, tantalum, titanium and transition metal nitrides like tungsten nitride.

According to a preferred embodiment each active area comprises a first and a second doped region and a channel region between the first and the second doped region. The first and the second doped regions have a first conductivity type. The channel regions are not doped or have a second conductivity type, which is contrary to the first conductivity type. Each channel region separates the first and the second doped region of the respective active area. The second doped region is formed in an upper section of the active area adjacent to a surface of the substrate. The first doped region is formed in a lower portion of the active area adjacent to the respective single sided bit line contact. The word lines are disposed adjacent to the channel regions. The bit lines are coupled to the first doped regions. Each active area comprises further a body contact region. The body contact regions have the second conductivity type. Each body contact region is formed adjacent to the respective first doped region, separates the first doped region from the adjacent bit line and extends from the channel region to the bulk section of the substrate. Each storage capacitor is coupled to the second doped region of the active area of the respective access transistor.

Thus each body contact region connects the channel region of the respective active area to the bulk section of the semiconductor substrate. An accumulation of minority charge carriers in the channel region is avoided and cell performance enhanced.

According to a further aspect, the invention provides a method of fabricating an access transistor array for memory devices, wherein bit line trenches are formed in a semiconductor substrate. A bottom insulating liner and a buried bit line are formed in lower portions of each bit line trench, wherein the bottom insulating liner insulates the respective bit line from the substrate. Above the bit lines the bit line trenches are filled with a sacrificial material. Insulating trenches are formed, wherein the insulating trenches extend perpendicular to the bit line trenches. A depth of the insulating trenches is selected such that opposing first and second vertical sidewalls of the bit lines are exposed at least partly within the insulating trenches. Thereby pillar portions are formed from the semiconductor substrate. Each pillar is arranged between two adjacent insulating trenches and two adjacent bit line trenches respectively. A wet etch mask is provided, wherein the wet etch mask covers the second vertical sidewalls of the bit lines within the insulating trenches. The first vertical sidewalls remain exposed. Then the bottom insulating liner is recessed. The recess starts from the exposed first vertical sidewalls and proceeds along the first sidewalls of the bit lines, such that divots are formed between the bit lines and the substrate. The divots extend along the first sidewalls of the bit lines. Then the divots are filled with conductive material. The conductive material filling the divots forms single sided bit line contacts. Each single sided bit line contact couples the respective bit line to one of the active areas adjacent to the first sidewall. Then a gate dielectric is formed on sidewalls of the pillars, which are exposed in the insulating trenches. Word lines are formed within the insulating trenches adjacent to the gate dielectric. Each word line extends along the respective insulating trench.

In a preferred embodiment, the bottom insulating liner is removed completely from the first sidewalls of the bit lines such that each single sided bit line contact extends between two adjacent insulating trenches. Thus the resistance of the single sided bit line contacts is minimized.

According to another preferred embodiment of the inventive method, the bit lines are formed from a transition metal or a transition metal nitride at least partly, thereby minimizing bit line resistance.

According to another preferred embodiment of the inventive method, the bit lines are formed from highly doped semiconductor material at least partly. A subsequent formation of first doped regions in the bottom portion of the pillars then may be supported by outward diffusion of the dopant of the semiconductor portion of the bit lines.

In other embodiments, the bit lines may comprise both highly doped semiconductor portions and transition metal portions.

Preferably a cap oxide is formed on top of the bit lines before the insulating trenches are formed. The cap oxide protects the underlying bit lines in following etch processes.

According to another preferred embodiment a top insulating liner is formed on sidewalls of the bit line trenches above the bit lines before the bit line trenches are filled with the sacrificial material, making feasible either a removal of the sacrificial material with the active areas being protected or the application of the sacrificial material as part of the insulating plug.

In a further preferred embodiment, a nitride spacer is formed on vertical sidewalls of the insulating trenches before the wet etch mask is provided, wherein the nitride spacer protects the active areas against following etch and implantation steps.

According to a further preferred embodiment of the inventive method the wet etch mask is provided by first depositing a conformal polycrystalline silicon layer. Then an angled implant is executed in line with the insulating trenches, such that second sections of the polycrystalline silicon layer covering the second vertical sidewalls of the bit lines within the insulating trenches are doped while first sections of the polycrystalline silicon layer covering the first vertical sidewalls of the bit lines within the insulating trenches remain undoped. Then the first portions of the polycrystalline silicon layer are removed selectively to the second portions. Thus a non-lithographic and self-aligning scheme for patterning the single sided bit line contacts is provided. Advantageously, two lithographic patterning processes are sufficient for patterning the access transistor array. Thereby the alignment of the two stripe-shaped masks is uncritical, as the two masks are orientated perpendicular to each other.

Preferably a well implant is executed before filling the divots, such that a buried layer of a second conductivity type is formed in the substrate in a depth corresponding to that of the bit lines or deeper. Further, a heavily doped semiconductor material, preferably polycrystalline silicon or polycrystalline germanium, is used as conductive material. Then first doped regions of a first conductivity type are formed in a bottom region of the pillars adjacent to the respective single sided bit line contact by outward diffusion of the dopant of the heavily doped polycrystalline silicon, wherein the buried layer is contradoped by the dopant in sections corresponding to the first doped regions. Thereby the first doped regions remain separated from the next bit line by a residual portion of the buried layer. The residual portions of the buried layer form body contact regions. A further well implant is executed, such that second doped regions of the first conductivity type are formed in upper portions of the pillars, wherein the well implant is executed such that each second doped region is separated from the respective first doped region by a channel region. Each channel region is connected to the bulk section of the substrate by means of the respective body contact region. Thus body contacts can be provided without increasing the cell size.

In a further preferred embodiment, the sacrificial material is substituted by a dielectric material, wherein the dielectric material forms insulating plugs, providing thereby enhanced insulating properties.

Other preferred embodiments of the inventive method comprise additional steps for to form wrap-around or surrounding gate structures. Thereby further sections of the gate dielectric are formed on the sidewalls of the pillars adjacent to the insulating plugs. Conductive material replaces the sacrificial material in the insulating plugs at least partly and is connected to the word lines.

According to one embodiment, the sacrificial material is recessed to a depth corresponding to or below the lower edge of the word lines, wherein pits are formed between the pillars within a row of pillars and wherein sections of the top insulating liner are exposed on sidewalls of the pits. The thickness of the exposed sections of the top insulating liner is reduced to provide sufficient capacitive coupling to the active areas in the pillars. The thinned sections of the top insulating liner are then effective as further sections of the gate dielectric. Lower sections of the pits substantially below the upper edge of the word lines are filled with a conductive material. The conductive material forms gate conductor plugs, which are connected to the word lines. Upper sections of the pits above the upper edge of the word lines are filled with an insulating material.

If the sacrificial material is polycrystalline silicon, additional temporary sections of the gate dielectric structure are formed on portions of the sacrificial material that are exposed within the insulating trenches, when the gate dielectric is formed on the sidewalls of the pillars. In a preferred embodiment such temporary sections of the gate dielectric are removed before filling the lower sections of the pits.

Preferably the thickness of the top insulating liner is reduced during the removing of the temporary sections of the gate dielectric.

These and other objects, features and advantages of the present invention will become apparent from the following detailed description of illustrative embodiments thereof, which is to be read in connection with the accompanying drawings.

BRIEF DESCRIPTION OF DRAWINGS

The disclosure will present in detail the following description of referred embodiments with reference to the following figures wherein:

FIG. 13 illustrates a perspective view of an access transistor array with surrounding gate structure in accordance with a further embodiment of the present invention;

Corresponding numerals in the different figures refer to corresponding parts and structures unless otherwise indicated. The figures are drawn to clearly illustrate the relevant aspects of the preferred embodiments and are not necessarily in all respects drawn to scale.

DETAILED DESCRIPTION

Figure 1A:
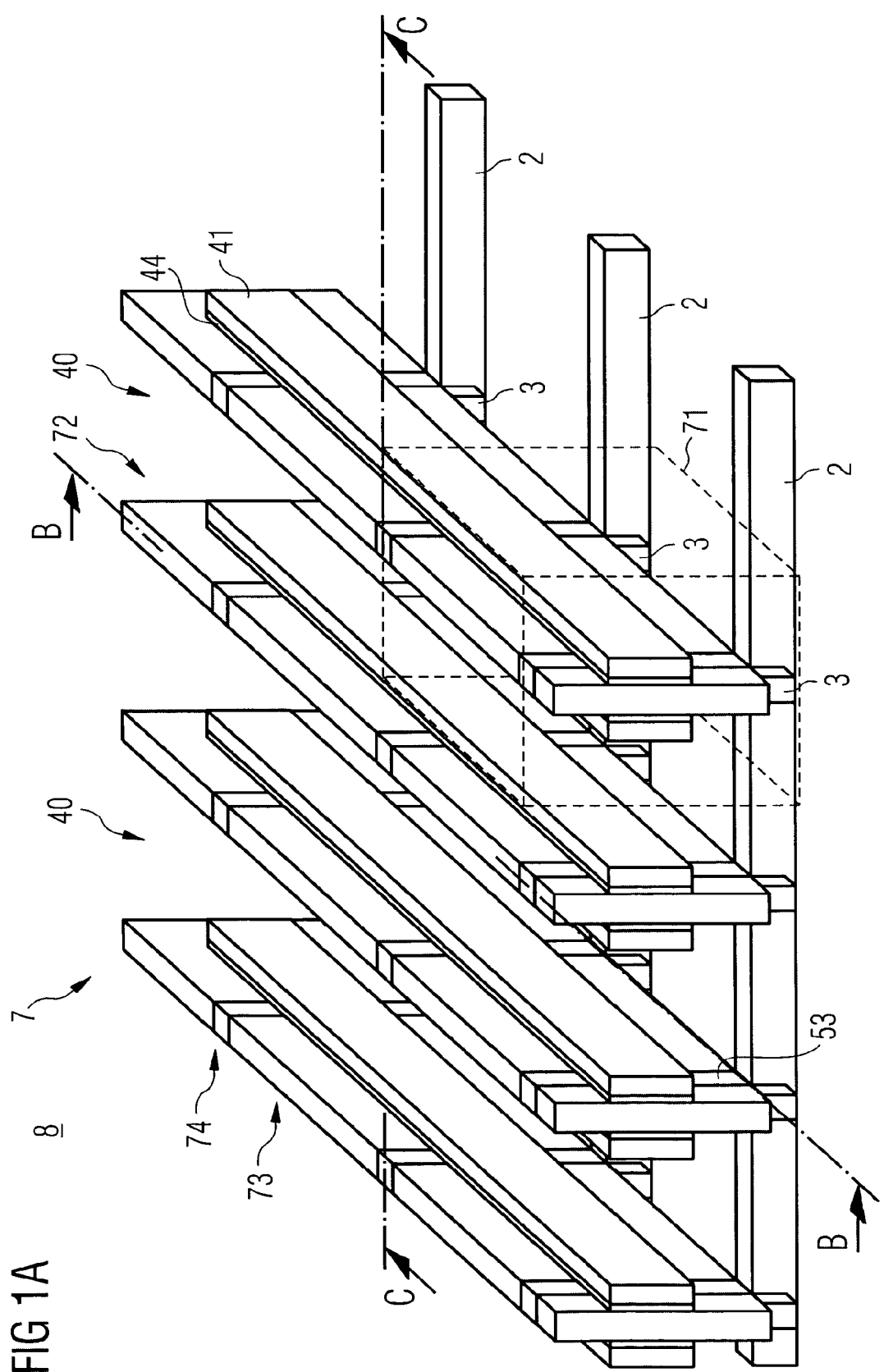
FIG. 1 illustrates a perspective view and cross-sectional views of an access transistor array with double-gated structure in accordance with a first embodiment of the present invention.
Figure 1B:
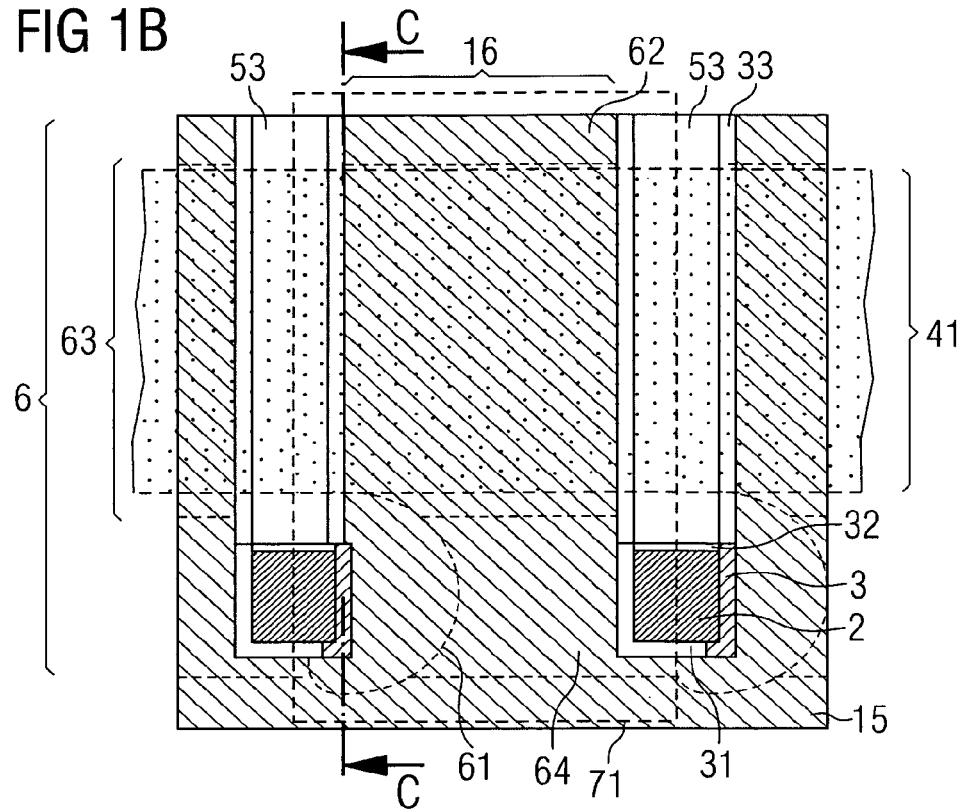
Figure 1C:
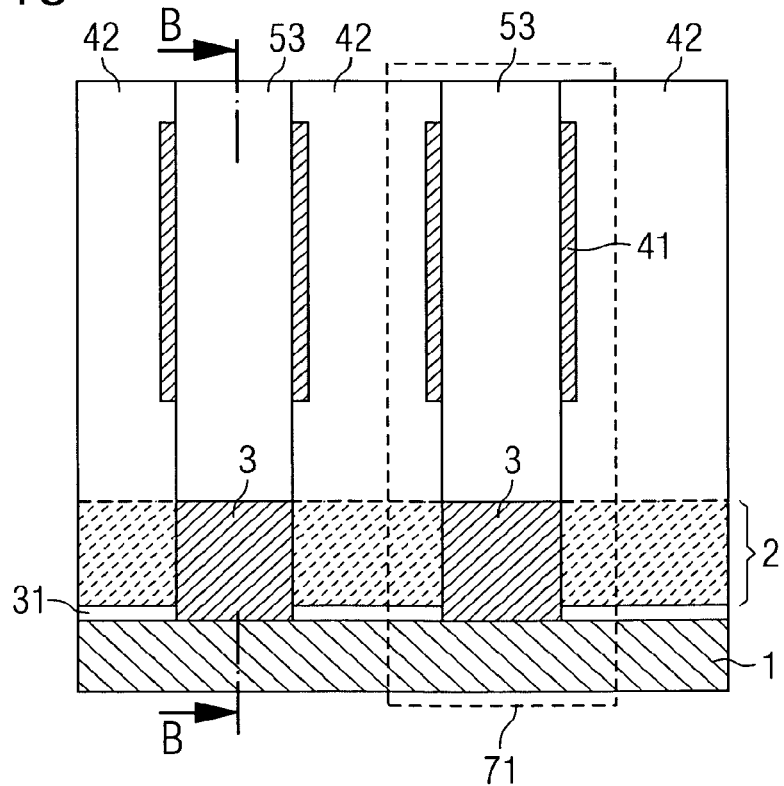

Referring to FIG. 2 through 9, process steps of fabricating the access transistor array of FIG. 1 are shown by means of plan views and cross-sectional views.

Referring to FIG. 2, a substrate 1 is provided. Substrate 1 is preferably formed from a semiconductor material such as single crystalline silicon.

A bit line mask layer is deposited on substrate surface 10 of substrate 1. The bit line mask layer is preferably formed from silicon nitride. The bit line mask layer is patterned by a photolithographic process to provide a stripe patterned bit line mask 81.

In one preferred embodiment of the invention, the width of both the lines of bit line mask 81 and the spaces between the lines is preferably a 1 F distance, wherein F is the minimum feature size that can be achieved by the respective photolithographic process for periodical line patterns. By a width of both the lines and the spaces of 1 F a cell size of 4 $F^2$ and thus a high packaging density is feasible.

In other embodiments of the invention the width of both the lines and the spaces is selected such that the electrical characteristics of the transistor or the process flow is improved. In the embodiment as illustrated in FIG. 2 to 9, the width of the spaces is determined to 1*F to optimize packaging density, while the width of the lines is 2*F for to enlarge channel width and for to improve device characteristics.

Bit line trenches 20 are etched in substrate 1 according to the pattern of bit line mask 81. The directional etching results in a plurality of column bars of semiconductor substrate 1 being separated by the bit line trenches 20 and extending along columns 73. A bottom insulating liner 31 is provided by thermal growth or deposition within bit line trenches 20 covering a bottom portion and sidewalls of the bit line trenches 20. A barrier liner 21 preferably of titanium nitride is deposited, covering the bottom insulating liner 31. Metal 22 is subsequently deposited in the bit line trenches 20. The metal 22 and the barrier liner 21 are etched back.

Figure 2A:
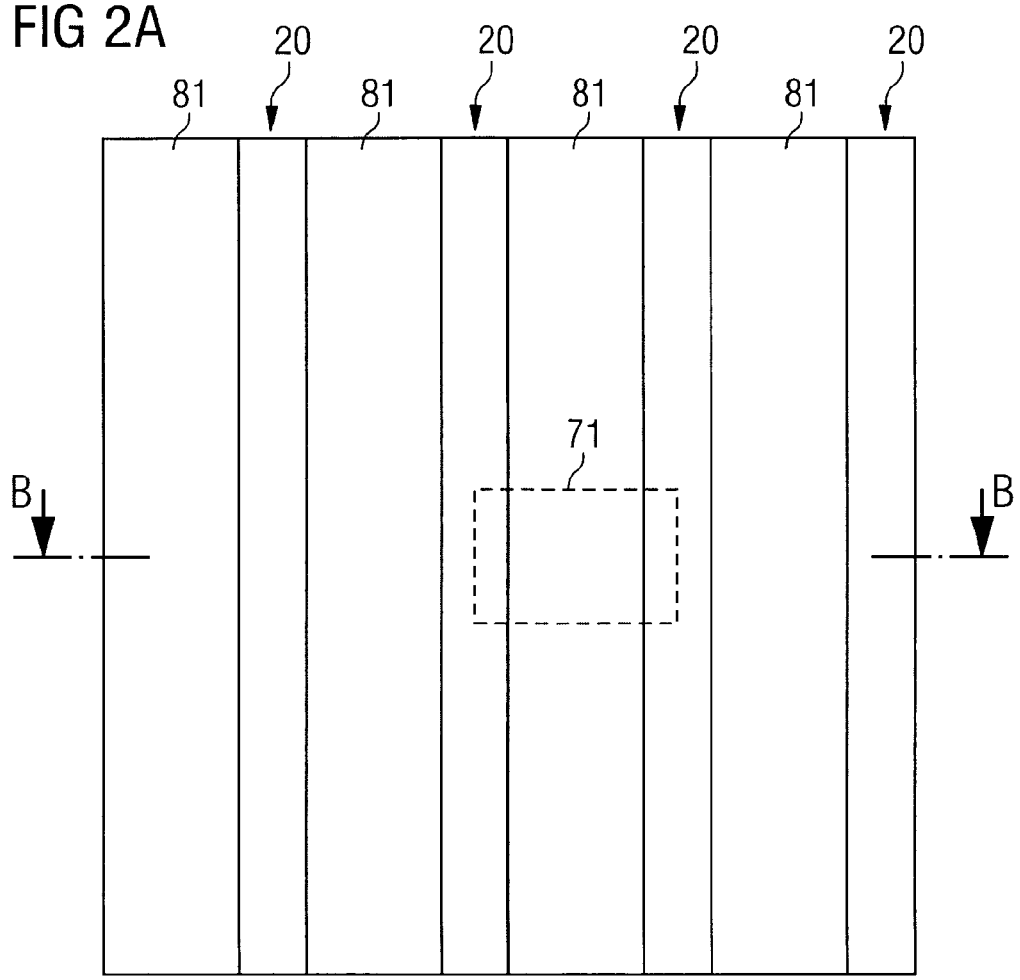
FIG. 2 is a plan view and a cross-sectional view of a semiconductor substrate having a buried bit line formed therein for processing in accordance with a first embodiment of the method of the present invention.
Figure 2B:
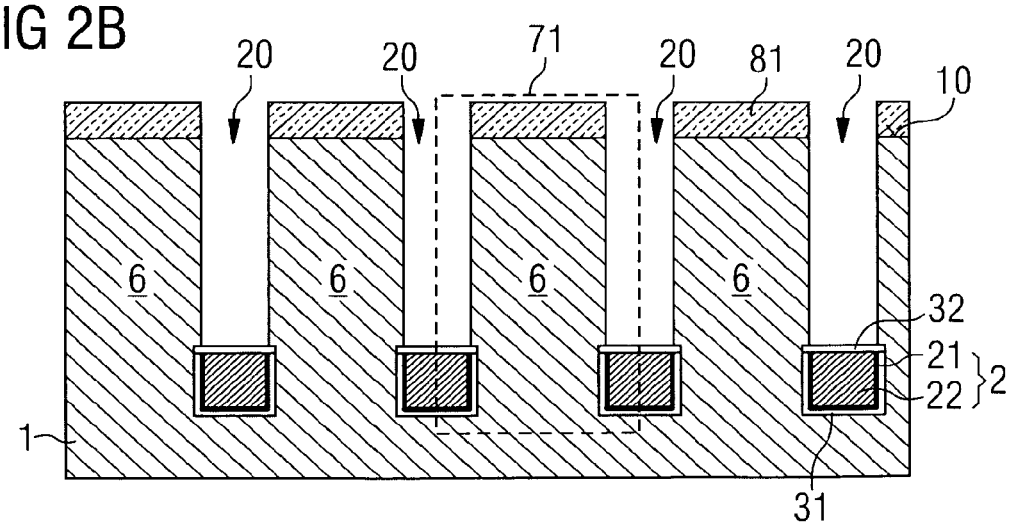

The cross-sectional view of FIG. 2B shows bit lines 2 comprising recessed metal 22 and recessed barrier liner 21 subsequent to the etching. Bottom insulating liner 31 separates bit lines 2 from substrate 1.

In one embodiment of the present invention a cap oxide 32 is provided on top of bit line 2. Cap oxide 32 protects bit lines 2 in subsequent etch processes.

The area of a single access transistor 71 of the access transistor array 7 is highlighted in both the plan view of FIG. 2A and the cross-sectional view of FIG. 2B.

Figure 3A:
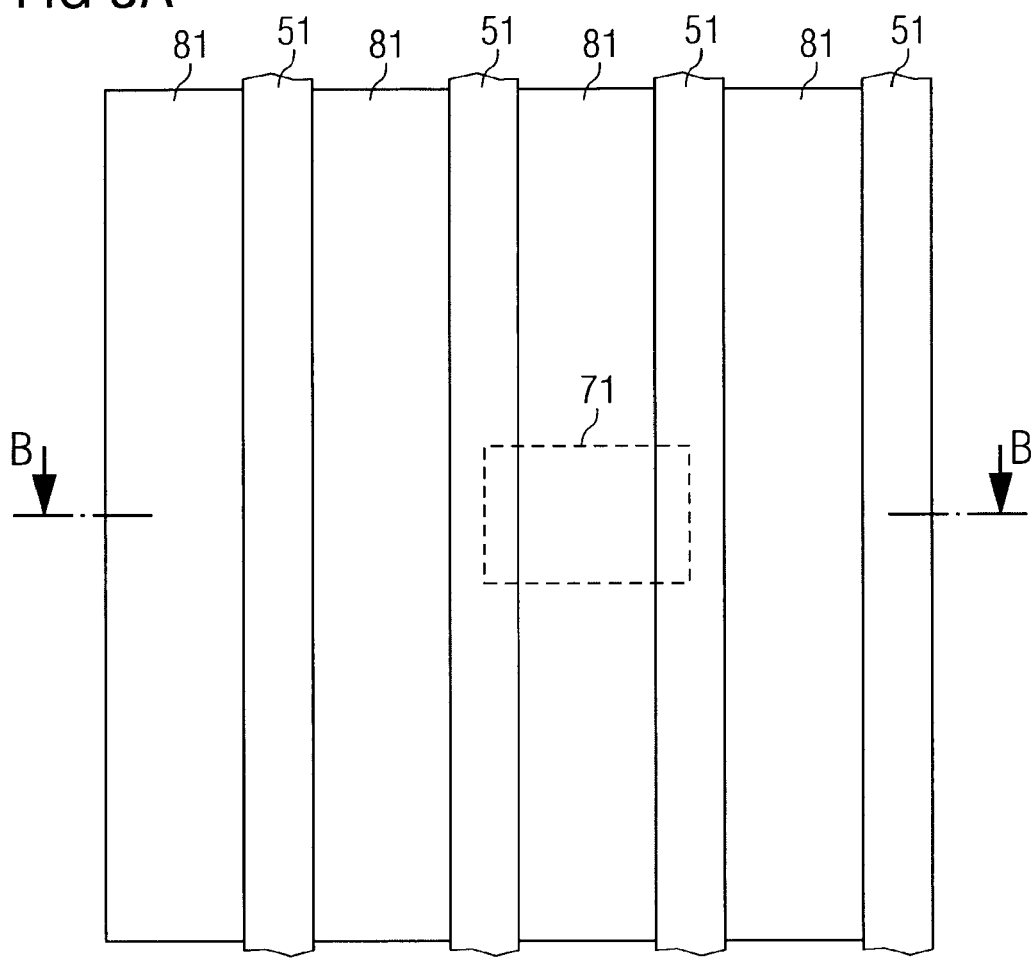
FIG. 3 is a plan view and a cross-sectional view of the semiconductor substrate of FIG. 2 having the buried bit line covered by a sacrificial material for processing in accordance with a first embodiment of the method of the present invention.
Figure 3B:
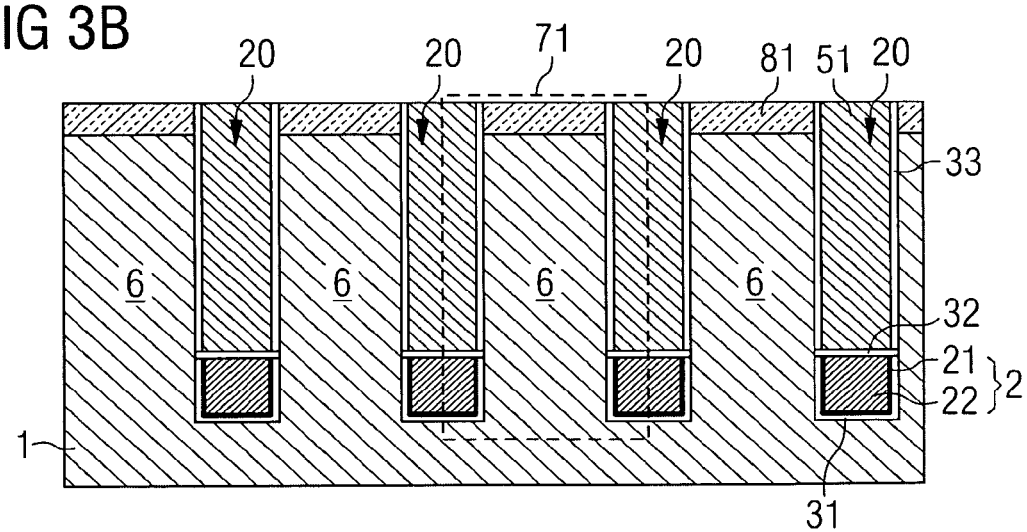

Referring to FIG. 3B, a top insulating liner 33 preferably from silicon oxide is formed on the sidewalls of the bit line trenches 20 above bit lines 2 by thermal growth or deposition.

A sacrificial material 51, preferably polycrystalline silicon, is deposited and recessed, such that the sacrificial material 51 fills bit line trenches 20 above bit lines 2.

Sacrificial material 51 fills bit line trenches 20 between an upper edge of bit line mask 81 and an upper edge of bit lines 2. Top insulating liner 33 separates sacrificial material 51 from substrate 1.

Figure 4A:
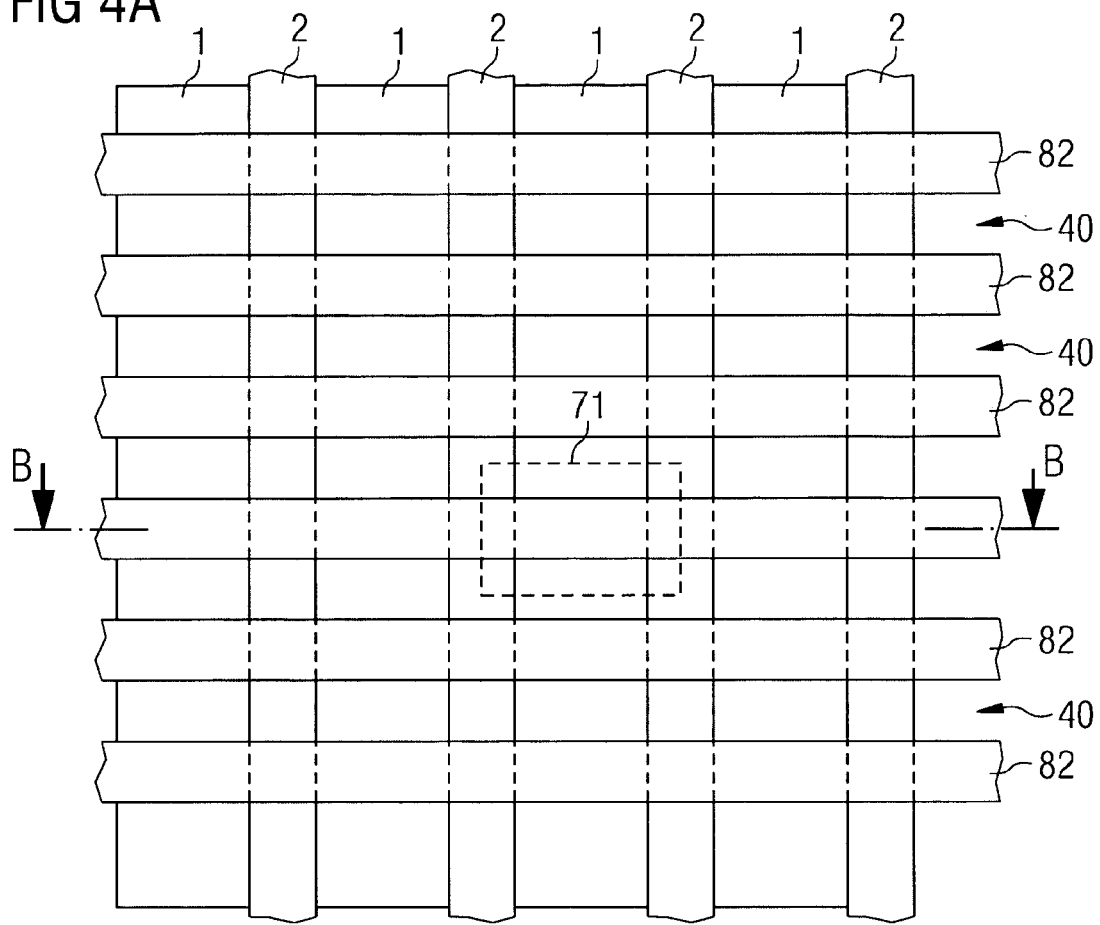
FIG. 4 shows plan views and cross-sectional views of the semiconductor substrate of FIG. 3 having insulating trenches formed in accordance with a first embodiment of the method of the present invention.
Figure 4B:
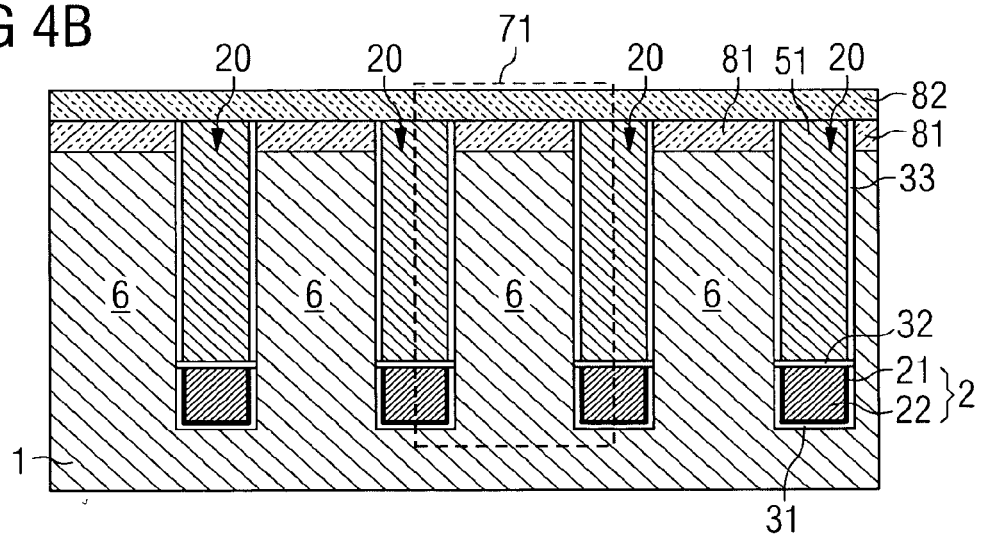
Figure 4C:
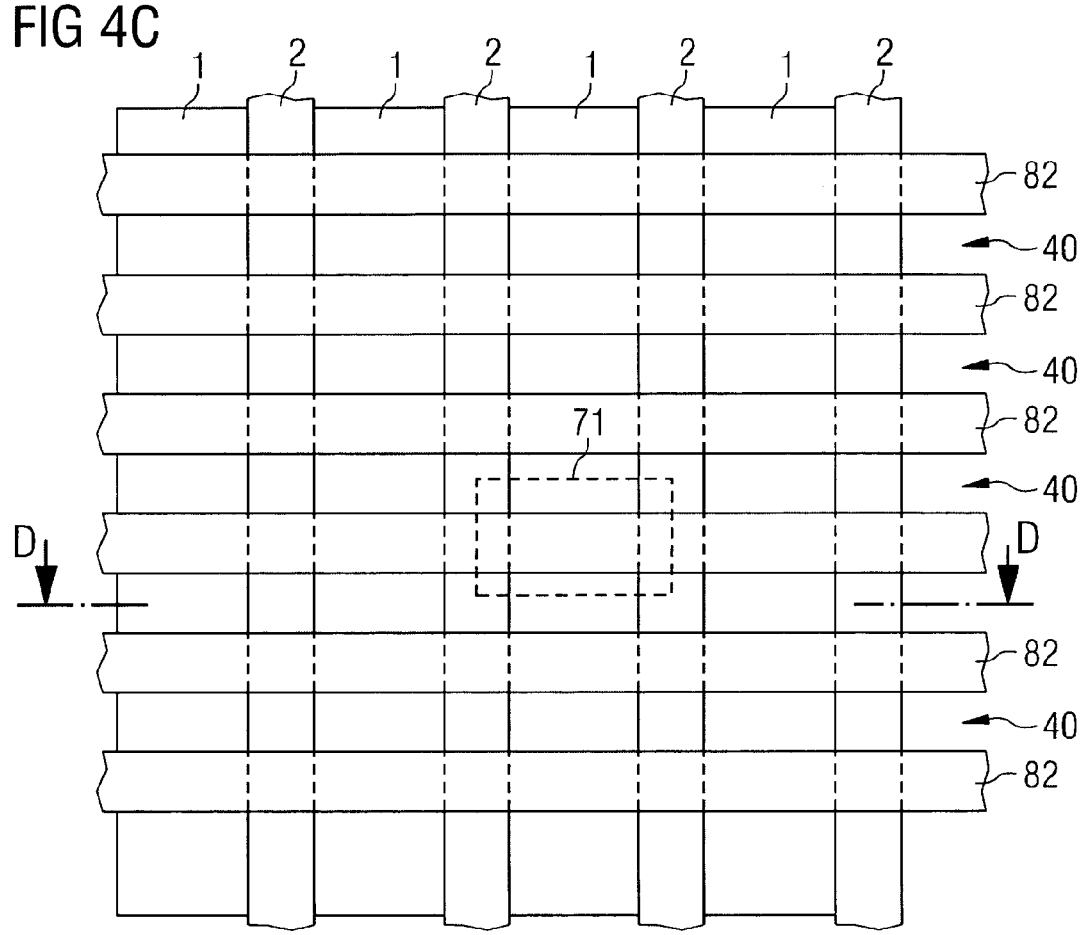

Another mask layer preferably from silicon nitride is deposited and patterned by means of a photolithographic process, such that an insulating trench mask 82 is provided (see, e.g., FIGS. 4A-C). The insulating trench mask 82 shows a stripe-shaped pattern of parallel lines and spaces extending orthogonal to the lines and spaces of bit line mask 81.

According to one embodiment of the invention, the width of both the lines and the spaces corresponds to the minimal feature size F for to achieve high packaging density.

Insulating trenches 40 (see, e.g., FIG. 4A) are then etched through the column bars formed from substrate 1 and sacrificial material 51 to a depth that is sufficient to expose vertical sidewalls of bit lines 2 at least partly. In one embodiment of the invention, the sidewalls are exposed completely and the depth of the insulating trenches 40 is at least that of the bit line trenches 20.

FIG. 4A illustrates a plan view of the bit lines 2 exposed within the insulating trenches 40. Between the bit lines 2 semiconductor substrate 1 is exposed in sections. Residual portions of sacrificial material 51 and the semiconductor substrate 1 located between the insulating trenches 40 are covered by the insulating trench mask 82 and form row bars.

In the area of a single access transistor 71, a not recessed portion of the semiconductor substrate 1 forms a substrate pillar 16 extending outwardly from an underlying bulk section 15 of substrate 1 (see, e.g., FIG. 7B) and wrapped-around by two neighboring insulating trenches 40 and two neighboring insulating plugs 53 (see, e.g., FIG. 9C), the latter consisting of the sacrificial material 51.

FIG. 4B is a cross-sectional view along cut line B-B of FIG. 4A along a row bar extending parallel to insulating trenches 40 and covered by a line of the insulating trench mask 82.

Figure 4D:
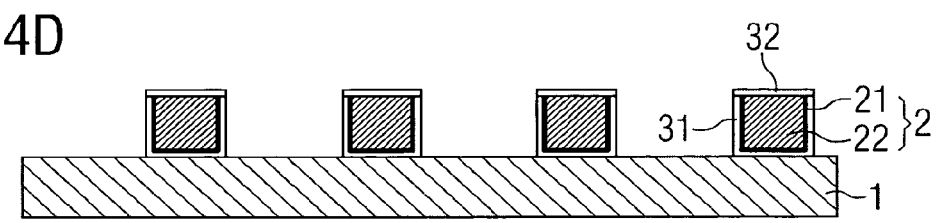

FIG. 4D illustrates a cross-sectional view along cut line D-D of FIG. 4C along an insulating trench. In the illustrated embodiment, insulating trenches 40 extend down to the bottom of bit lines 2 such that the sidewalls of bit lines 2 are completely exposed within the insulating trenches 40. In other embodiments, which are not depicted, insulating trenches 40 expose the sidewalls of the bit lines 2 only in parts.

A nitride spacer 52 is provided on the vertical sidewalls of insulating trenches 40. In one embodiment of the invention the nitride spacer 52 is grown selectively on silicon. In other embodiments a conformal nitride liner is deposited and etched back in an anisotropic manner, such that the nitride liner is completely removed from the exposed portions of the vertical sidewalls 201, 202 of the bit lines 2 while still covering completely the silicon portions of the row bars.

A masking layer preferably from polycrystalline or amorphous silicon is deposited. The masking layer has by way of example a thickness of less than a half of the height of the bit lines.

By an angled implant 37 in line with the insulating trenches 40 second sections of the masking layer are doped with a dopant while first sections in the shade of the bit lines 2 remain undoped. The undoped first sections of the masking layer are then removed selectively against the doped sections by a suitable etching process. The remaining second sections form a wet etch mask 36.

Figure 5A:
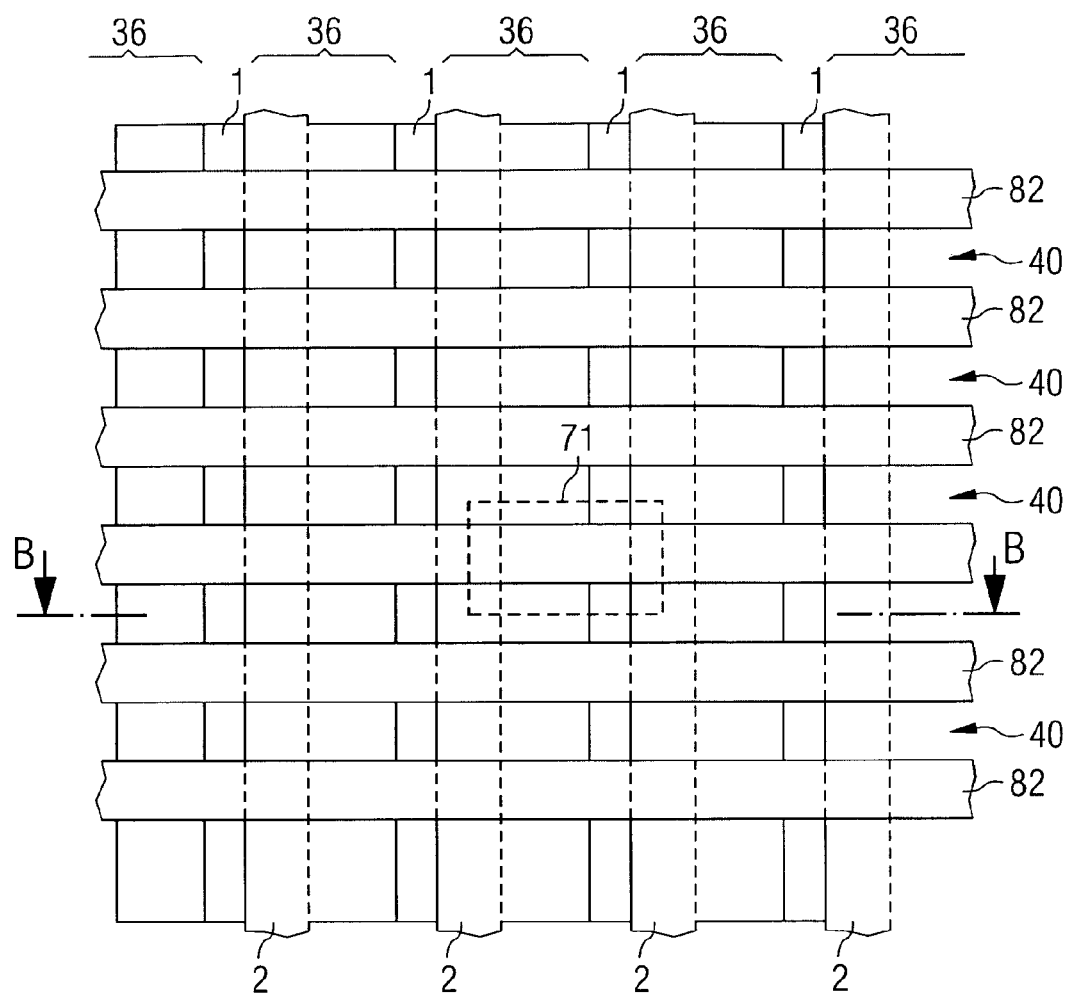
FIG. 5 shows plan views and cross-sectional views of the semiconductor substrate of FIG. 4 having a wet etch mask formed for processing in accordance with a first embodiment of the method of the present invention.

FIG. 5A is plan view showing the wet etch mask 36, covering both bit lines 2 and second sections of substrate 1 adjacent to a second side of bit lines 2 within insulating trenches 40. Substrate 1 is exposed in first sections adjacent to first sidewalls 201 of bit lines 2, wherein the first sidewalls 201 and the second sidewalls 202 are vertical sidewalls on opposite sides of bit lines 2.

Figure 5B:
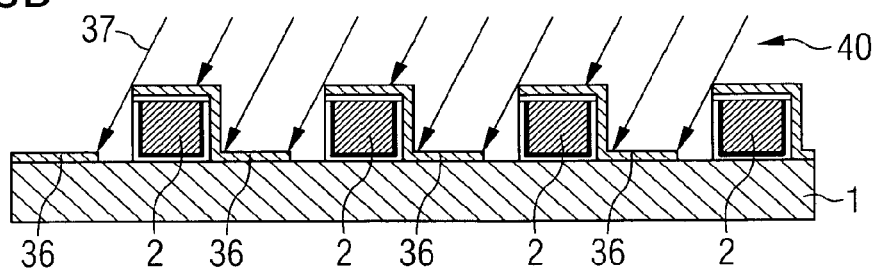

FIG. 5B is a cross-sectional view along cut line B-B of FIG. 5A. The angled implantation is illustrated by arrows 37. The angle of the angled implantation 37 may be such that a width of the shaded first sections of the masking layer is greater than the thickness of the masking layer.

Figure 5C:
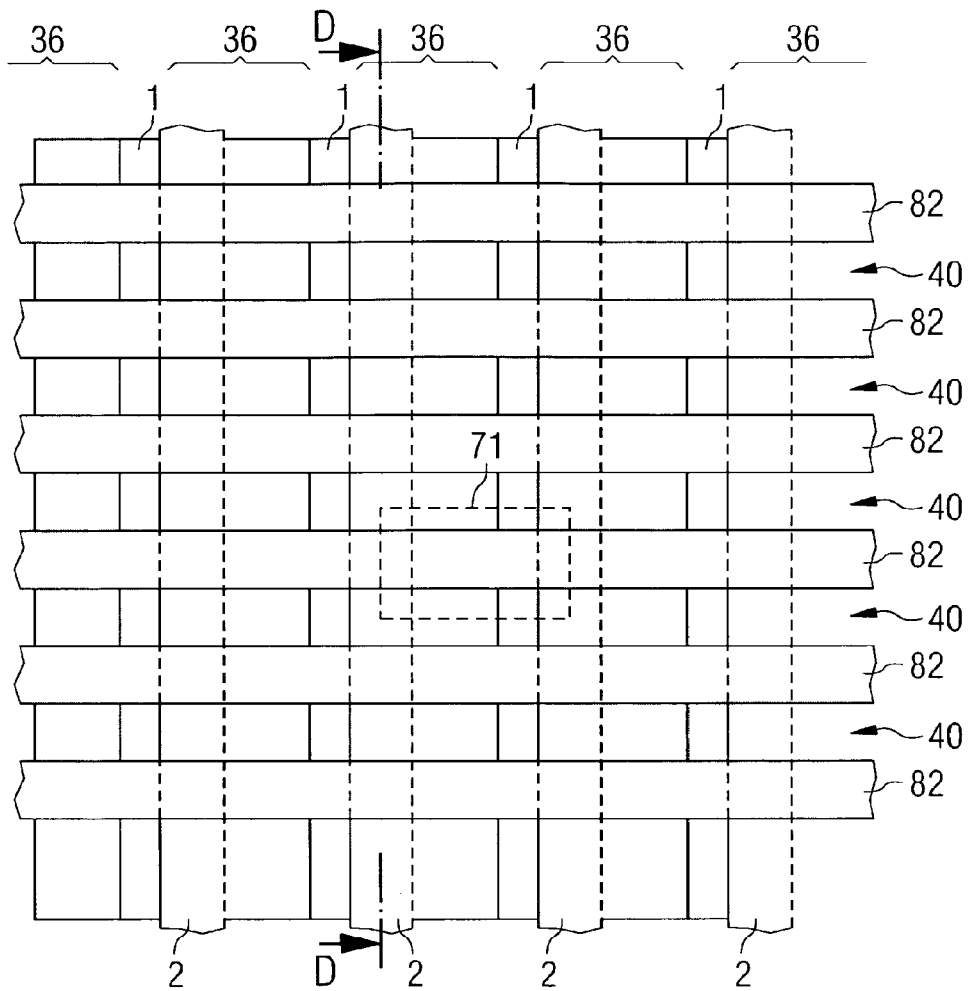
Figure 5D:
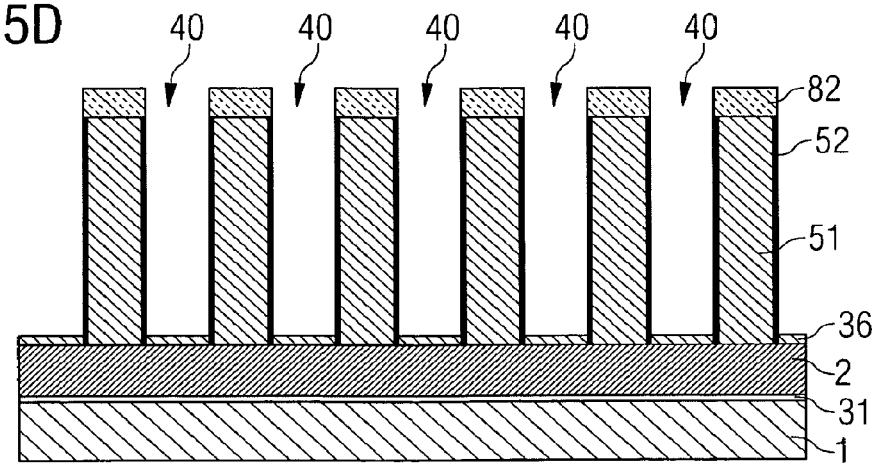

Referring to FIG. 5D, which is a cross-sectional view along cut line D-D of FIG. 5C, the nitride spacer 52 covers the vertical sidewalls of row bars formed from sacrificial material 51 and substrate pillars 16.

A wet etch step is performed, which removes the material of the bottom insulating liner 31 selectively against substrate 1, barrier liner 21 and nitride spacer 52. The wet etch has an isotropic nature. The wet etch recesses bottom insulating liner 31 starting from exposed portions of the bottom insulating liner 31 on the first sidewalls 201 of bit lines 2 and is effective in all directions.

Figure 6A:
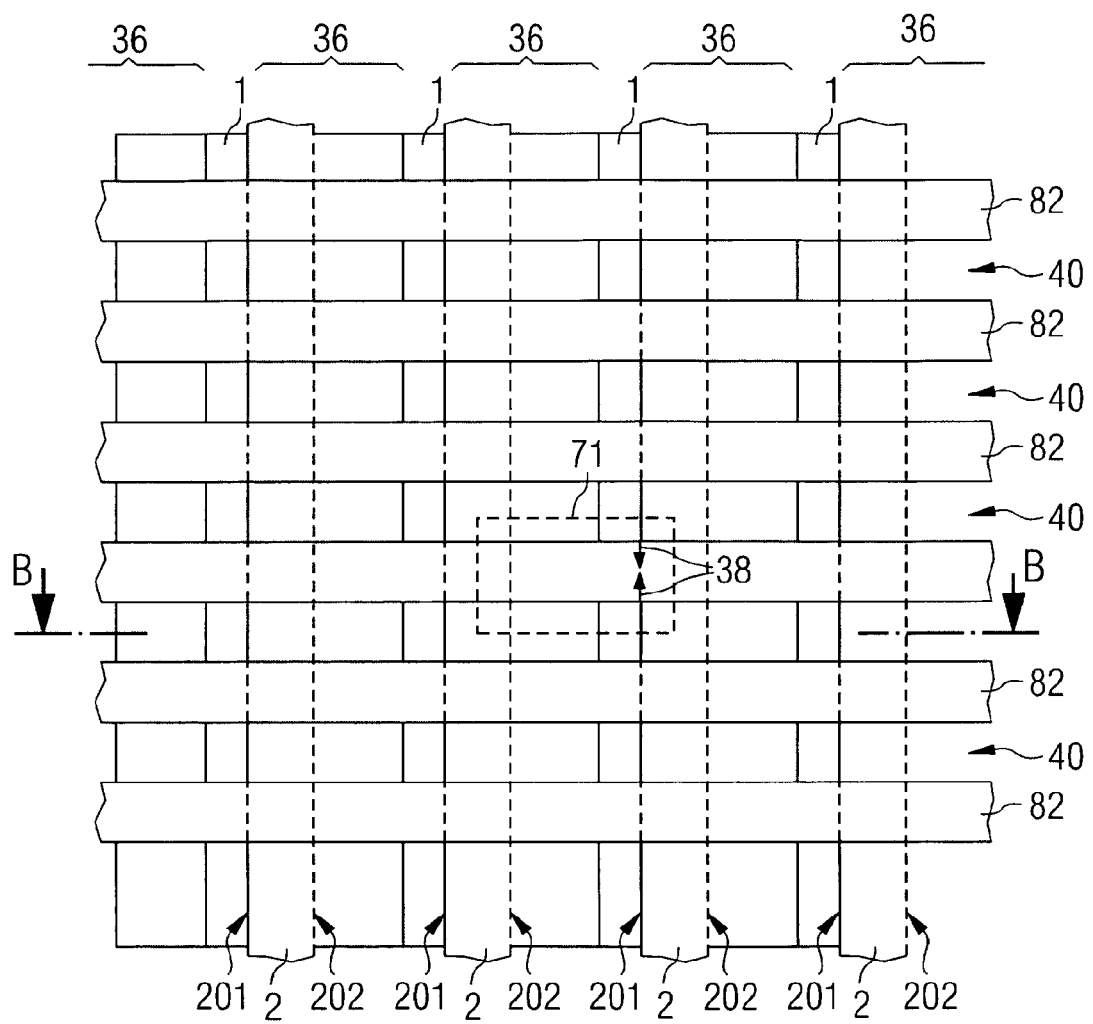
FIG. 6 illustrates a plan view and a cross-sectional view of the semiconductor substrate of FIG. 5 having divots in an insulating liner formed for processing in accordance with a first embodiment of the method of the present invention.

In FIG. 6A the directions, in which the bottom insulating liner 31 is recessed, are illustrated by arrows 38. The bottom insulating liner 31 is removed from the first sidewalls 201 of the bit lines 2 at least in parts, preferably completely.

Figure 6B:
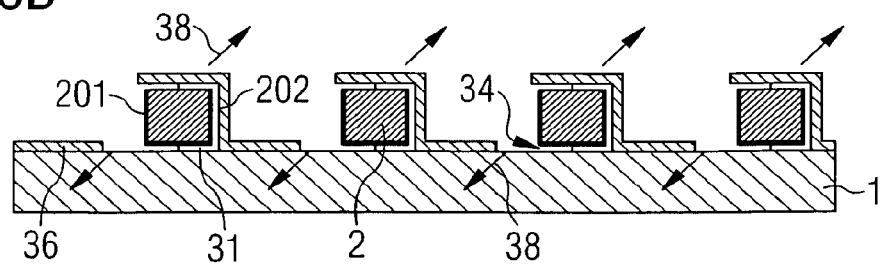

Referring to FIG. 6B, which is a cross-sectional view along cut-line B-B of FIG. 6A, insulator divots 34 between bit lines 2 and the underlying portions of substrate 1 are formed by the wet etch step. The insulator divots 34 extend along the sidewalls of respective bit lines 2 from the exposed portions of the sidewalls within the insulating trenches 40 to not more than the middle of the respective bit line 2. Further insulator divots (not shown) extending rectangular to the cut line undercut the adjacent row bars and extend along the first sidewalls 201 of bit lines 2.

In this example the insulator divots 34 extend from one insulating trench 40 to the respective neighboring insulating trench 40 undercutting thereby completely the row bars between two adjacent insulating trenches 40 respectively.

Doped semiconductor material, preferably polycrystalline silicon or polycrystalline germanium, is deposited according to techniques known in the art such that the insulator divots 34 are filled. Polycrystalline silicon that is deposited outside the insulator divots 34 is removed anisotropically in a dry etch step. Residual portions of the polycrystalline silicon fill the insulator divots 34 and form single sided bit line contacts 3.

Figure 7A:
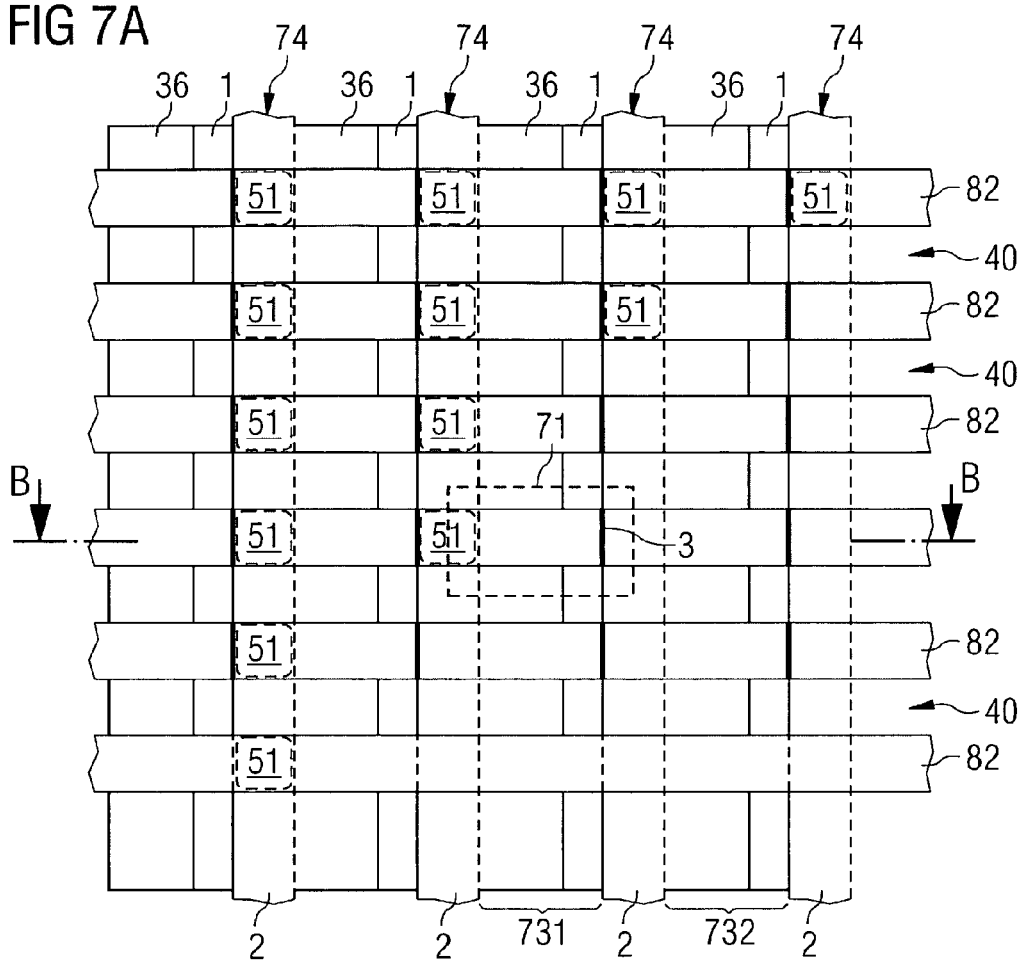
FIG. 7 illustrates a plan view and a cross-sectional view of the semiconductor substrate of FIG. 6 having single sided bit line contacts formed for processing in accordance with a first embodiment of the method of the present invention.

FIG. 7A shows a plan view, in which the area of a single access transistor 71 is highlighted. Single sided bit line contact 3 couples the highlighted access transistor 71 to the right handed bit line 2.

Figure 7B:
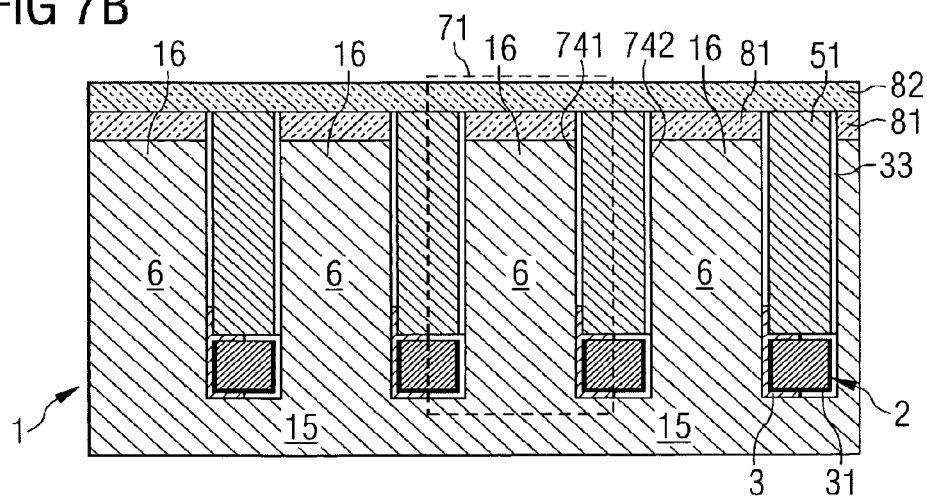

Referring to FIG. 7B, which is a cross-sectional view along cut line B-B of FIG. 7A, pillars 16 of substrate 1 form active areas 6 of access transistors 71. Bit lines 2 are located in a lower section of bit line trenches 20 and separate the active areas 6 within the rows 72. A sacrificial material 51 fills an upper section of bit line trenches 20. Each pillar 16 with active area 6 is adjacent to two neighboring bit lines 2. The active area 6 of each pillar 16 is coupled to the respective right handed bit line 2 by means of single sided bit line contact 3 and is separated from the left handed bit line 2 by residual portions of the bottom insulating liner 31.

Preferably a well implant is executed in the foregoing, at the latest before filling the divots 34, such that a buried layer of a second conductivity type is formed in the substrate 1 in a depth corresponding to that of the bit lines 2. First doped regions 61 of a first conductivity type are formed in a bottom region of the pillars 15 adjacent to the respective single sided bit line contact 3 by outward diffusion of the dopant of the highly doped polycrystalline silicon. The buried layer is contradoped in sections corresponding to the first doped regions 61 by the dopant. Thereby the first doped regions 61 remain separated from the respective next bit line 2 by a residual portion of the buried layer. The residual portions of the buried layer form body contact regions 64.

The nitride spacers 52 are removed by stripping, such that the vertical sidewalls of the pillars 16 are exposed. According techniques known in the art gate dielectric 44 and word lines 41 are formed on sidewalls of the pillars 16 adjacent to the channel regions 63.

Figure 8A:
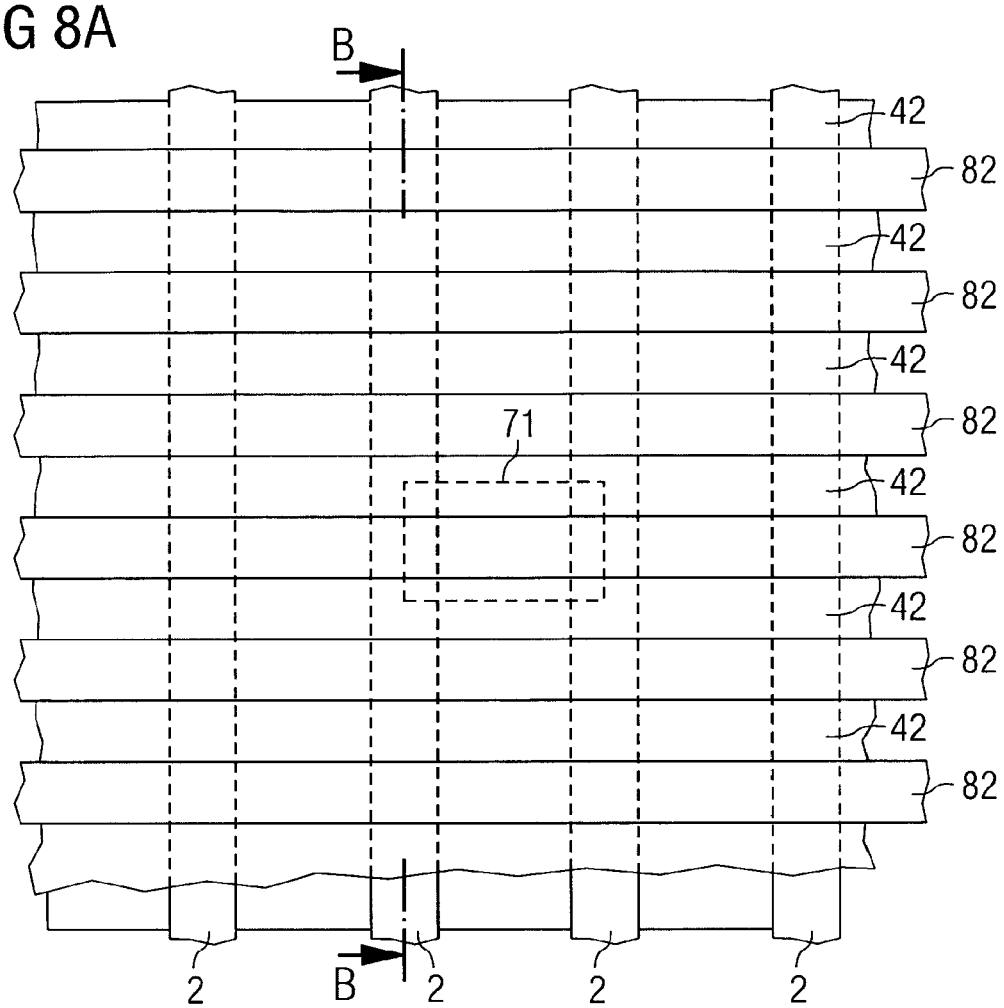
FIG. 8 illustrates a plan view and a cross-sectional view of the semiconductor substrate of FIG. 7 having word lines formed for processing in accordance with a first embodiment of the method of the present invention.
Figure 8B:
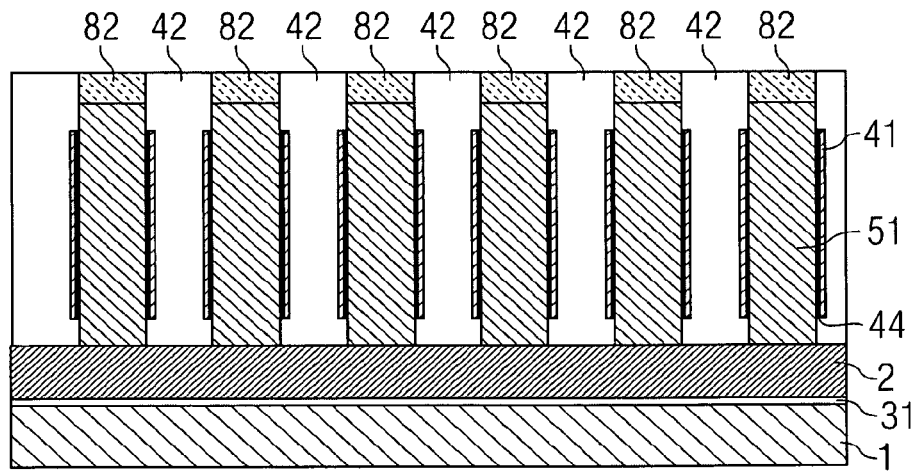
Figure 9A:
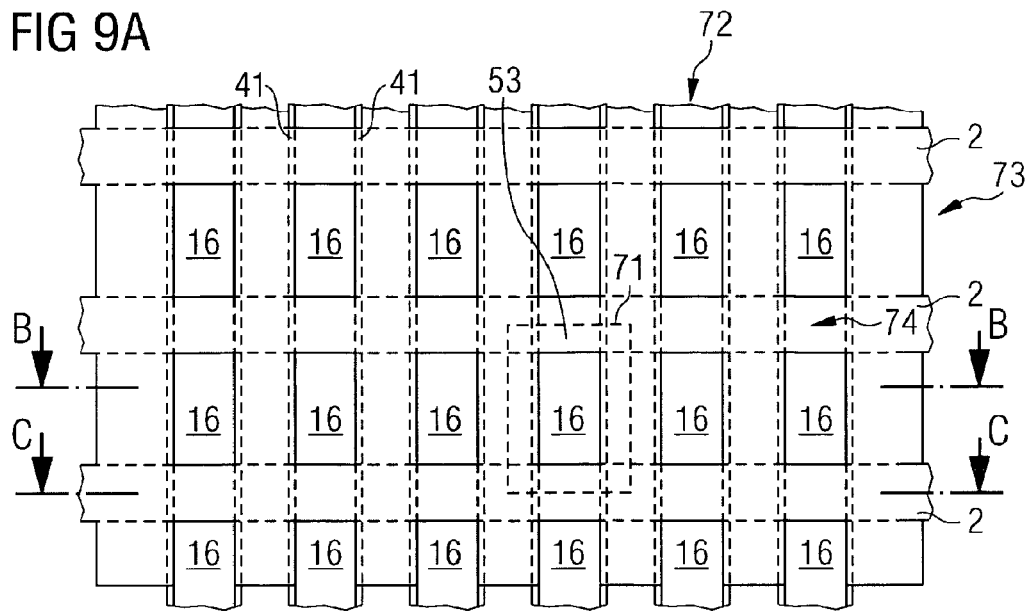
FIG. 9 illustrates a plan view and cross-sectional views of the semiconductor substrate of FIG. 6 having a trench insulating mask removed and being planarized for processing in accordance with a first embodiment of the method of the present invention.
Figure 9B:
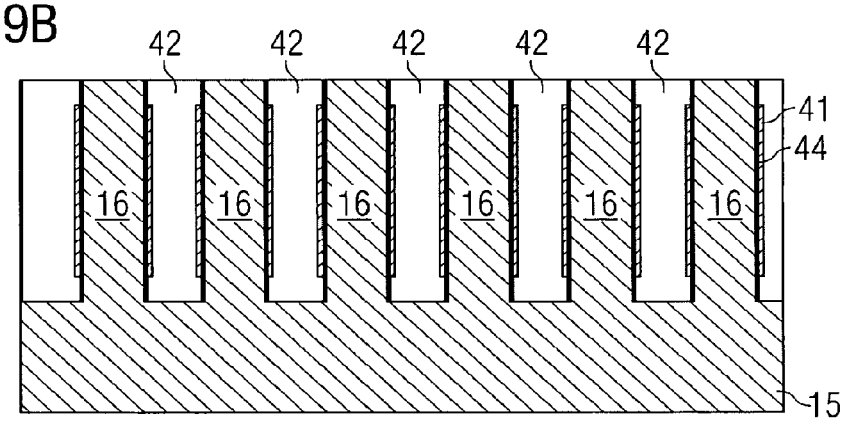
Figure 9C:
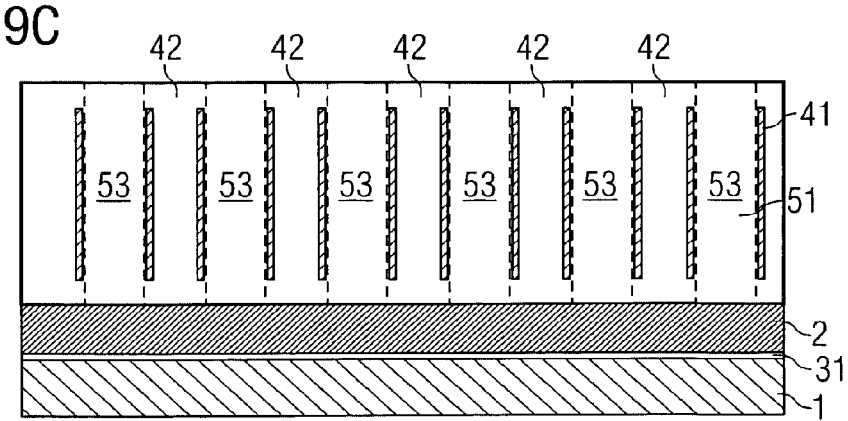

FIG. 8B, which is a cross-sectional view along cut-line B-B of FIG. 8A, shows word lines 41 extending in pairs on opposite sidewalls of row bars, which are formed from pillars 16 and comprise active areas 6 and plugs of sacrificial material 51.

A dielectric word line fill provides an insulating structure 42 separating pairs of spacer word lines 41 formed respectively within each insulating trench 40.

The insulating trench mask 82 is removed. Residual portions of bit line mask 81 cover the pillars 16 with active areas 6 while the sacrificial material 51 is exposed.

Sacrificial material 51 is removed and replaced by an insulating material, such as silicon dioxide or silicon nitride for to provide enhanced cell isolation.

The structure is planarized wherein residual portions of the insulating trench mask 82 are removed. The structure thus formed is then processed to fabricate a storage capacitor or another storage device on the planarized surface, using known techniques followed by conventional back end of line (BEOL) procedures.

The final structure of the access transistor array is illustrated in a perspective view and further cross-sections in FIG. 1.

FIG. 1 to 9 refer to double gated structures for open bit line cell concepts. Other embodiments of the invention, which are not illustrated, refer to single gated structures for both for open and folded bit line cell concepts.

In single gated structures for open bit line concepts the respective word line may be disposed in one of the insulation trenches adjacent to the respective row of pillars while the opposing insulation trench is either filled completely with insulating material or buries a reference gate line.

In a single gated structure for folded bit line concepts each word line is coupled alternately to an active area of one of two adjacent rows of pillars.

Figure 10A:
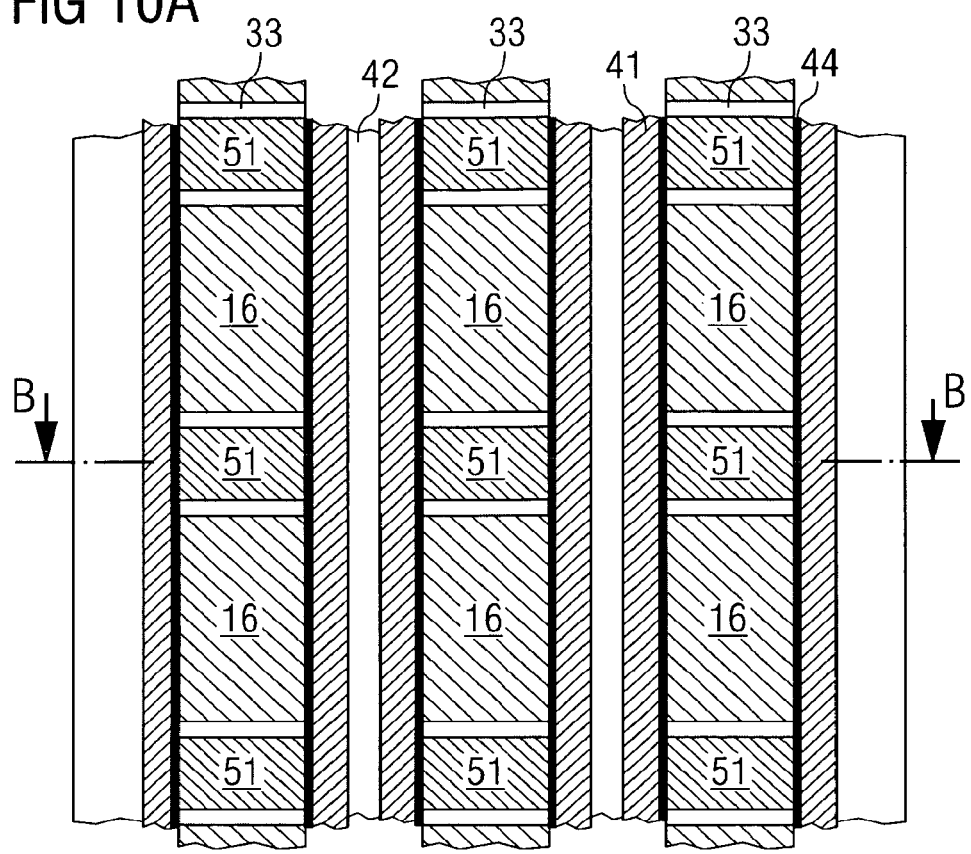
FIG. 10 illustrates an enlarged plan sectional view and an enlarged cross-sectional view of the semiconductor substrate of FIG. 8.
Figure 10B:
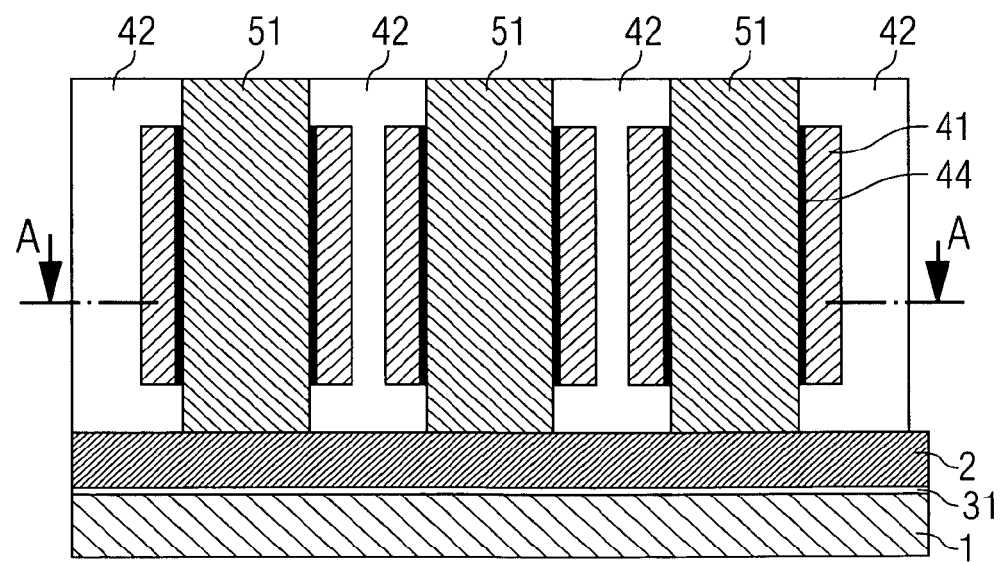
Figure 11A:
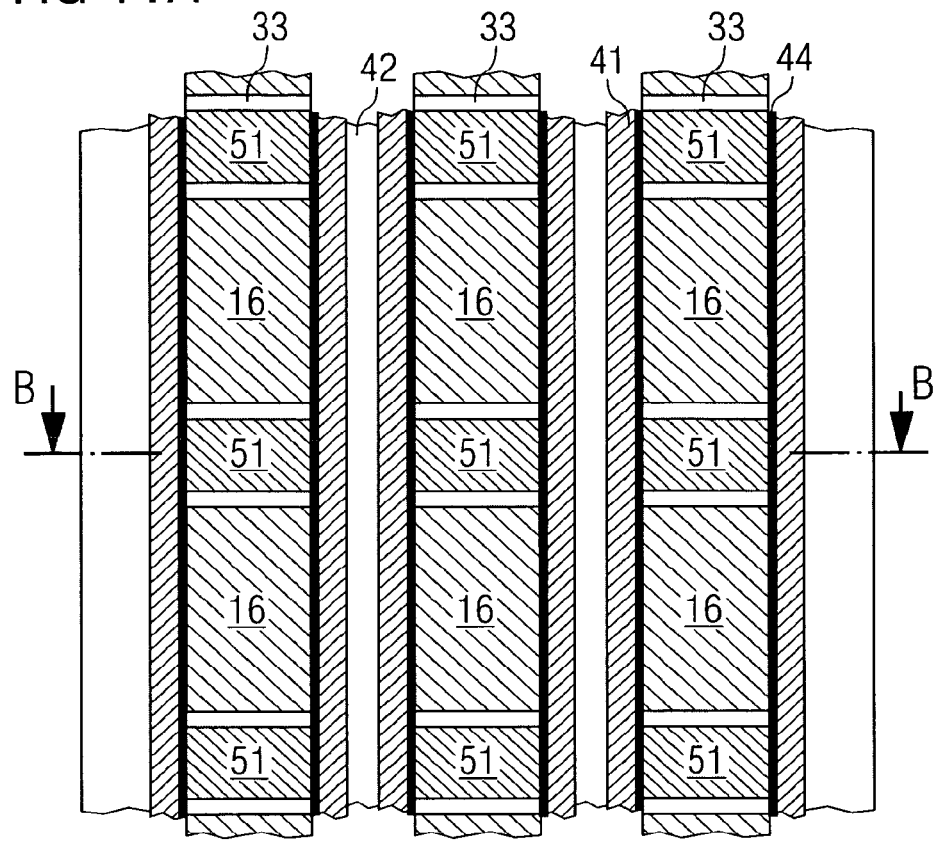
FIG. 11 illustrates a plan sectional view and a cross-sectional view of the semiconductor substrate of FIG. 10 having a sacrificial material being recessed for processing in accordance with a second embodiment of the method of the present invention.
Figure 11B:
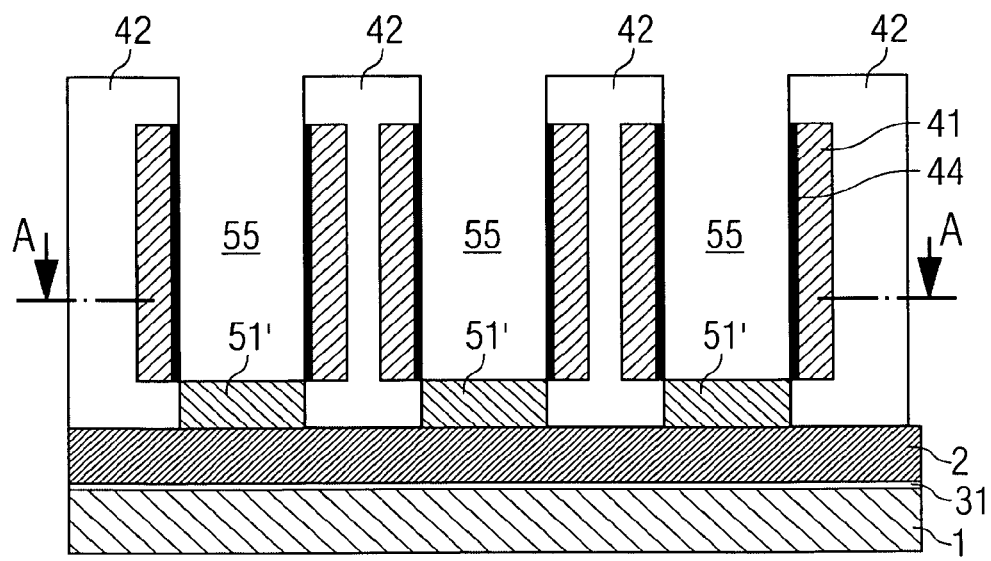

FIG. 10 to 12 refer to a method for providing access transistor arrays with surrounded gate structures. While for double-gated structures the sacrificial material is replaced completely by an insulating material, a gate dielectric and a conductive material are provided in lieu of the insulating material for to provide surrounded gate structures.

FIG. 10B is an enlarged section of FIG. 8B. FIG. 10A is a horizontal cross-section with the cut line between the upper and the lower edge of word lines 41.

Word lines 41 run along the rows of pillars 16. A gate dielectric 44 separates the word lines 41 from pillars 16 and sacrificial material 51. A top insulating liner 33 insulates the pillars 16 from sacrificial material 51.

Referring to FIG. 1B, sacrificial material 51 is etched back to a depth at least corresponding to the lower edge of word lines 41, wherein pits 55 are formed between adjacent pillars 16 within the same row of pillars 72. Sections of gate dielectric 44 adjacent to the pits 55 and upper portions of the top insulating liner 33 are exposed.

The thickness of the exposed sections of the top insulating liner 33 is reduced. The exposed sections of the gate dielectric 44 adjacent to the pits 55 are removed. Both steps are preferably performed as one wet etch step, wherein the wet etch step is effective on both the material of gate dielectric 44 and on the material of top insulating liner 33. Preferably both the gate dielectric 41 and the top insulating liner 33 are made from an oxide, such as silicon oxide.

A conductive material is deposited into the pits 55 and recessed to a depth not exceeding the upper edge of word lines 44. An insulating material is deposited to complete the filling of the pits 55.

Figure 12A:
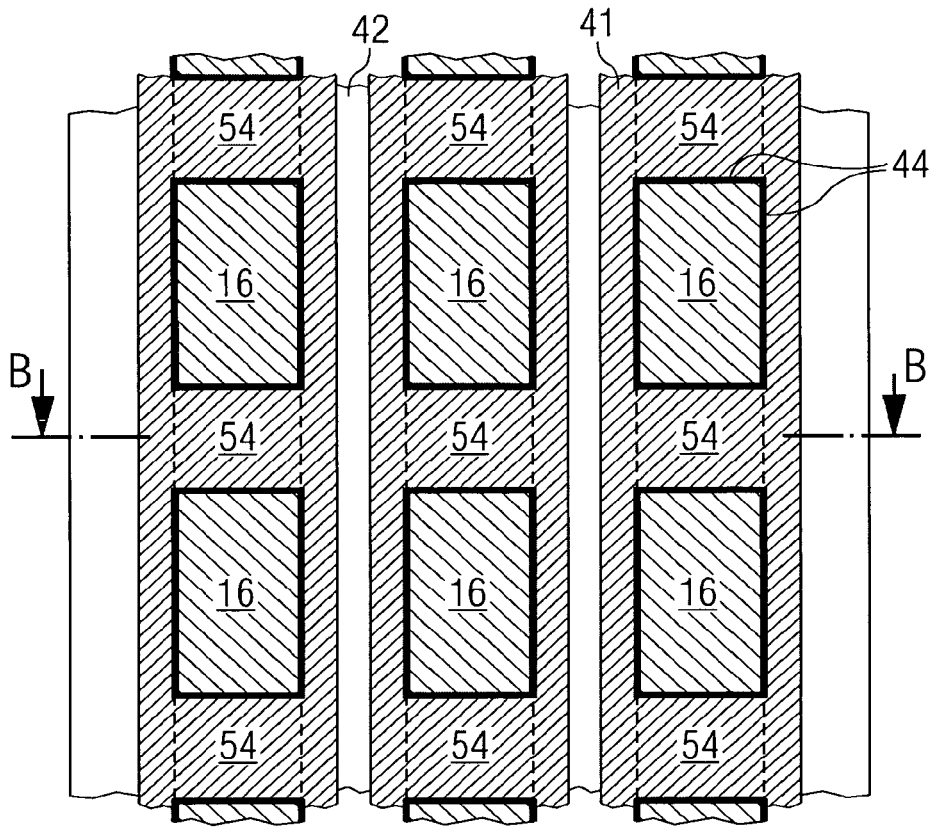
FIG. 12 illustrates a plan sectional view and a cross-sectional view of the semiconductor substrate of FIG. 10 having gate conductor plugs for processing in accordance with a second embodiment of the method of the present invention.

Referring to FIG. 12A, the deposited conductive material forms gate conductor plugs 54. Each gate conductor plug 54 connects electrically two word lines, which extend on opposing sides of the respective row of pillars 72. The thinned sections of the recessed top insulating liner 33 forms a further section of gate dielectric 44 and couples the gate conductor plugs 54 capacitively to the adjacent active areas formed within the pillars 16, such that portions of a conductive channel within the channel section of the active area are formed adjacent to the gate conductor plug 54. A surrounding gate structure comprising two opposing word lines 44 and two gate conductor plugs 54 is formed.

According to the example, the conductive material is polycrystalline silicon.

Figure 12B:
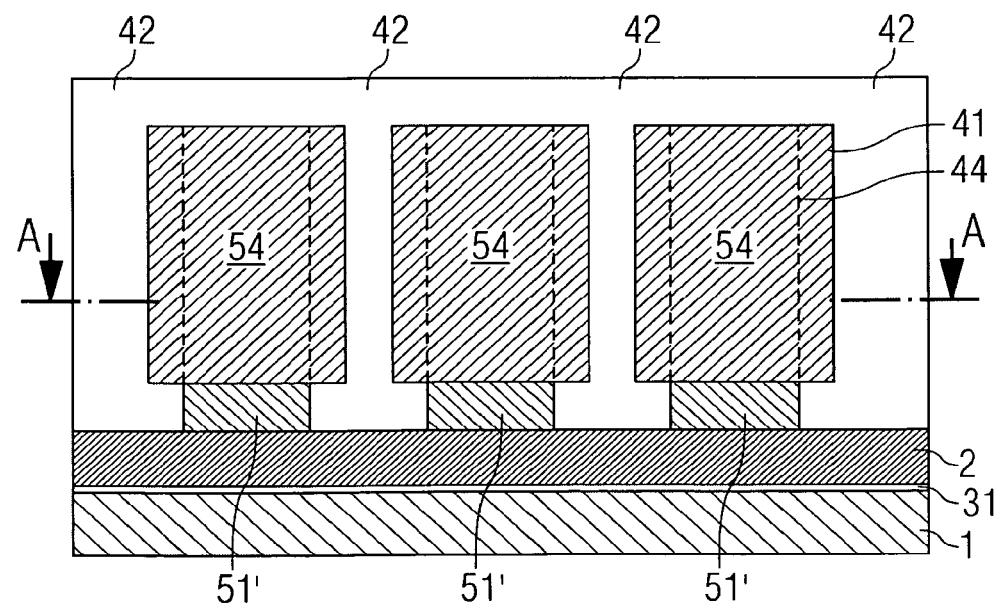
Figure 14A:
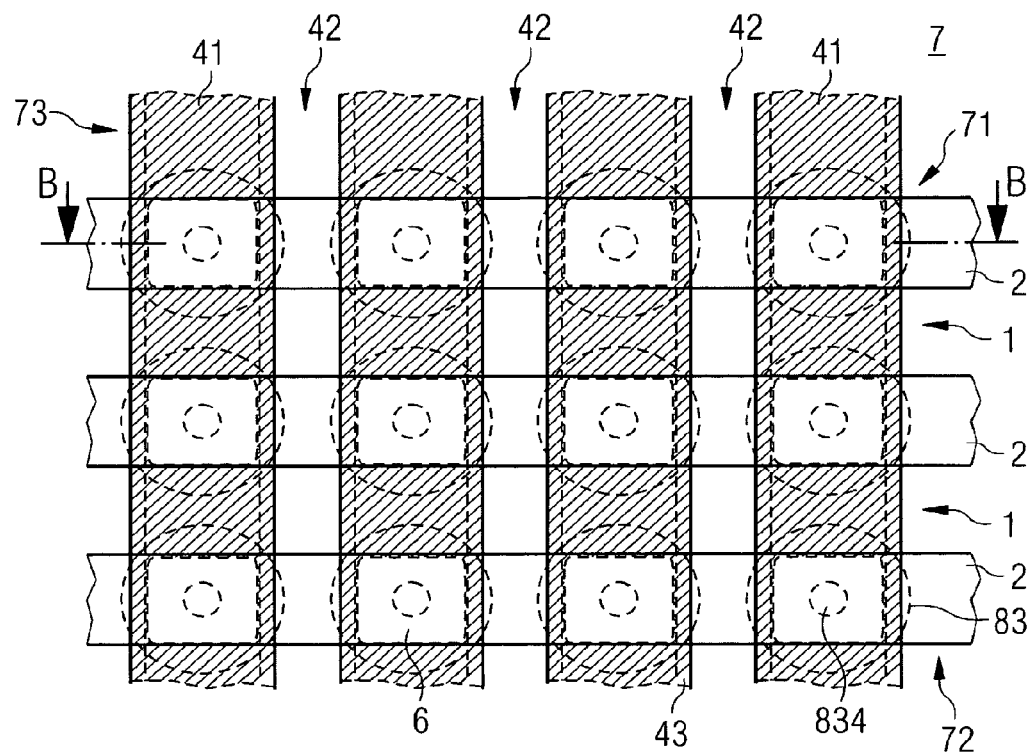
FIG. 14 illustrates a plan view and a cross-sectional view of a vertical channel access transistor array according to prior art.
Figure 14B:
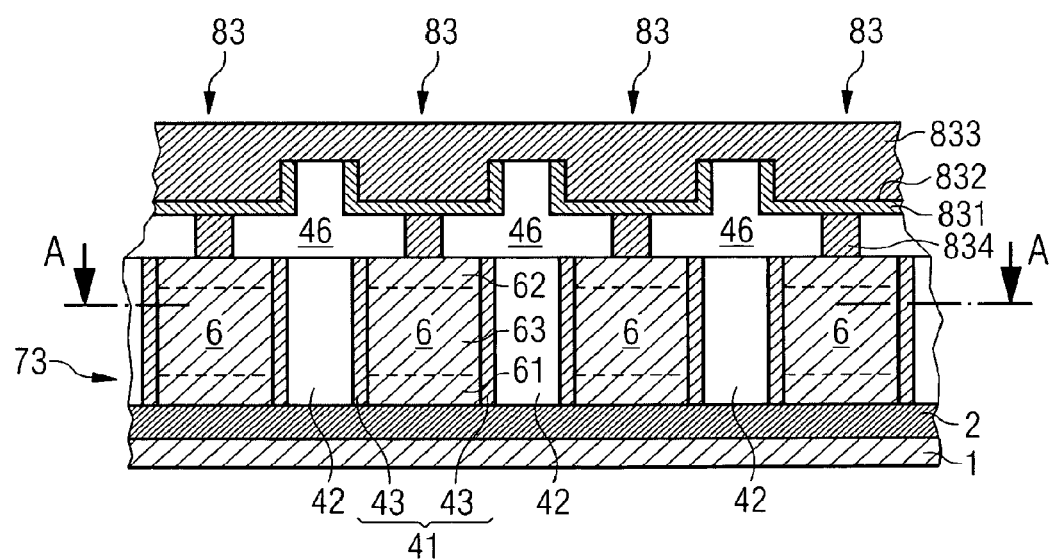

FIG. 12B, which is a cross-sectional view along cut line B-B of FIG. 12A, shows residual portions 51' of sacrificial material 51 below a lower edge of the word lines 41. Gate conductor plugs 54 connect pairs of word lines 41. An insulating material covers the gate conductor plugs 54 above the upper edge of word lines 41.

Another embodiment of the inventive access transistor array with surrounding gate structure is shown in the perspective view of FIG. 13. The gate conductor plugs 54 extend between the bit lines 2 and the upper edge of the pillars 16. A cap oxide (not shown) separates the gate conductor plugs 54 from the bit lines 2.

Having described preferred embodiments of transistor arrays with vertical channel access transistors and methods for fabricating access transistor arrays with low bit line resistance and improved switching characteristics, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit including a memory device, the memory device comprising:
   transistors comprising a first source/drain portion, a second source/drain portion, and a channel region disposed between the first and the second source/drain portions;
   buried bitlines disposed in a semiconductor substrate and coupled to the second source/drain portions of the transistors; and
   buried wordlines disposed over the bitlines, wherein the semiconductor substrate includes a bulk section that lies below the buried bitlines and pillar sections that are continuous with and extend from the bulk section of the semiconductor substrate, the transistors being disposed in the pillar sections such that the channel regions of the transistors are electrically connected to the bulk section of the semiconductor substrate.

2. The integrated circuit of claim 1, wherein the bitlines comprise metal.

3. The integrated circuit of claim 1, wherein the channel extends in a direction that is approximately perpendicular with respect to a main surface of the semiconductor substrate.

4. The integrated circuit of claim 1, wherein the wordlines are disposed in isolation trenches that are disposed in the semiconductor substrate.

5. The integrated circuit of claim 1, wherein the memory device further comprises memory cells having a cell size of 4 F*F.

6. An integrated circuit including a memory device, the memory device comprising
buried bitlines disposed in a semiconductor substrate;
buried wordlines disposed in the semiconductor substrate;
memory cells having a cell size of 4 F*F, the memory cells including transistors comprising first and second source/drain portions and a channel region disposed between the first and second source/drain portions,
wherein the buried wordlines are connected with the gate electrodes, and wherein the semiconductor substrate includes a bulk section that lies below the buried bitlines and pillar sections that are continuous with and extend from the bulk section of the semiconductor substrate, the transistors being disposed in the pillar sections such that the channel regions of the transistors are electrically connected to the bulk section of the semiconductor substrate.

7. The integrated circuit of claim 6, wherein the wordlines are disposed over the bitlines in the semiconductor substrate.

8. The integrated circuit of claim 6, wherein the channel region extends in a direction that is approximately perpendicular with respect to a main surface of the semiconductor substrate.

9. The integrated circuit of claim 8, wherein the second source/drain portions of the transistors are coupled to the bitlines.

10. The integrated circuit of claim 8, wherein the wordlines are disposed in isolation trenches that are disposed in the semiconductor substrate.

11. The integrated circuit of claim 8, wherein the wordlines are disposed over the bitlines.

12. The integrated circuit of claim 8, wherein the bitlines comprise metal.

13. The integrated circuit of claim 1, wherein the semiconductor substrate further comprises body contact regions disposed adjacent to the second source/drain portions at bases of the pillar sections, the body contact regions directly coupling the channel regions to the bulk section of the semiconductor substrate, wherein the channel regions, the body contact regions, and the bulk semiconductor region are portions of a single crystalline semiconductor.

14. The integrated circuit of claim 6, wherein the semiconductor substrate further comprises body contact regions disposed adjacent to the second source/drain portions at bases of the pillar sections, the body contact regions directly coupling the channel regions to the bulk section of the semiconductor substrate, wherein the channel regions, the body contact regions, and the bulk semiconductor region are portions of a single crystalline semiconductor.

* * * * *